(12) United States Patent
Saito et al.

(10) Patent No.: US 7,812,398 B2
(45) Date of Patent: Oct. 12, 2010

(54) SEMICONDUCTOR DEVICE INCLUDING A P-TYPE FIELD-EFFECT TRANSISTOR

(75) Inventors: Shinichi Saito, Kawasaki (JP); Digh Hisamoto, Kokubunji (JP); Yoshinobu Kimura, Tokyo (JP); Nobuyuki Sugii, Tokyo (JP); Ryuta Tsuchiya, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 18 days.

(21) Appl. No.: 12/400,324

(22) Filed: Mar. 9, 2009

(65) Prior Publication Data
US 2009/0261412 A1    Oct. 22, 2009

Related U.S. Application Data

(62) Division of application No. 11/746,230, filed on May 9, 2007, now Pat. No. 7,531,853.

(30) Foreign Application Priority Data
Jun. 8, 2006    (JP)    ............ JP2006-159239

(51) Int. Cl.
H01L 27/01    (2006.01)
H01L 27/12    (2006.01)

(52) U.S. Cl. ............... 257/347; 257/627; 257/649; 257/E29.151

(58) Field of Classification Search ............ 257/347, 257/627, 649, E29.151
See application file for complete search history.

(56) References Cited

U.S. PATENT DOCUMENTS

| | | | |
|---|---|---|---|
| 7,445,978 B2 * | 11/2008 | Teh et al. ............... | 438/199 |
| 7,525,162 B2 * | 4/2009 | Yin et al. ............... | 257/369 |
| 2007/0205444 A1 * | 9/2007 | Luo et al. ............... | 257/288 |
| 2008/0203487 A1 * | 8/2008 | Hohage et al. ........... | 257/369 |
| 2009/0026549 A1 * | 1/2009 | Teh et al. ............... | 257/369 |

OTHER PUBLICATIONS

J. Welser, et al.; Strain Dependence of the Performance Enhancement in Strained-Si n-MOSFETs; IEEE; Technical Digest of International Electron Device Meeting; 1994, pp. 372-376.

Kazuyuki Hozawa, et al.; True Influence of Wafer-Backside Copper Contamination During the Back-End Process on Device Characteristics; IEEE; Technical Digest of International Electron Device Meeting; 2002; pp. 737-741.

F. Ootsuka, et al.; A Highly Dense, High-Performance 130nm node CMOS Technology for Large Scale System-on-a-Chip Applications; IEEE; Technical Digest of International Electron Device Meeting; 2000; pp. 574-579.

(Continued)

*Primary Examiner*—Ngan Ngo
(74) *Attorney, Agent, or Firm*—Antonelli, Terry, Stout & Kraus, LLP.

(57) ABSTRACT

A semiconductor device and manufacturing method of the same is provided in which the driving current of a pMOSFET is increased, through a scheme formed easily using an existing silicon process. A pMOSFET is formed with a channel in a <100> direction on a (100) silicon substrate. A compressive stress is applied in a direction perpendicular to the channel by an STI.

2 Claims, 31 Drawing Sheets

OTHER PUBLICATIONS

P. Bai, et al. A 65nm Logic Technology Featuring 35nm Gate Lengths, Enhanced Channel Strain, 8 Cu Interconnect Layers, Low-k ILD and 0.57um2 SRAM Cell; IEEE; Technical Digest of International Electron Device Meeting; 2004; pp. 656-661.

H. Sayama, et al.; Effect of <100> Channel Direction for High Performance SCE Immune pMOSFET with Less Than 0.15um Gate Length; IEEE; Technical Digest of International Electron Device Meeting; 1999; pp. 657-660.

Digh Hisamoto, et al.; A Folded-channel MOSFET for Deep-sub-tenth Micron Era; Technical Digest of International Electron Device Meeting; 1998; pp. 1032-1035.

H. Irie, et al.; In-Plane Anisotropy of MOS Inversion Layer Mobility on Silicon (100), (110) and (111) surfaces; International Conference on Solid State Device and Materials, Tokyo; 2004; pp. 724-725.

\* cited by examiner

PMOS NMOS

SEMICONDUCTOR DEVICE INCLUDING A P-TYPE FIELD-EFFECT TRANSISTOR

CROSS-REFERENCE TO RELATED APPLICATION

The application is a divisional of U.S. application Ser. No. 11/746,230, filed May 9, 2007, now U.S. Pat. No. 7,531,853, and which application claims priority from Japanese patent application No. JP 2006-159239 filed on Jun. 8, 2006, the contents of which is hereby incorporated by reference into this application.

TECHNICAL FIELD OF THE INVENTION

The present invention relates to a semiconductor device and its manufacturing method and, particularly, to a semiconductor device in which the mobility of a field-effect transistor is improved, and its manufacturing method.

BACKGROUND OF THE INVENTION

LSI (Large Scale Integration) technology using silicon is an indispensable technology in modern society. For example, LSIs are mounted on personal computers and cellular phones. LSIs include something called a processor that processes information, such as a CPU (Central Processing Unit). To process more information, information processing has to proceed faster. Enhancement of device performance has been made so far mainly through device microfabrication. That is, the performance of transistors is increased through microfabrication of each transistor that processes information, thereby making it possible to operate at higher speeds. Performance enhancement through device microfabrication in this manner is called scaling, which has become a leading principle supporting the semiconductor industry.

However, with minimum processing dimension at a manufacturing level becoming less than 100 nm, a significant difficulty has occurs to further device microfabrication. For example, each transistor supporting a CPU is mainly a Metal Oxide Semiconductor Field Effect Transistor, and the film thickness of a gate insulating film of the MISFET is less than 2.0 nm. This is as thin as approximately ten atom layers. If the film is made to be thinner, a tunnel current flows directly through the gate insulating film, and a power consumption increases.

To solve this problem, research and development of a high-dielectric-constant gate insulating film with dielectric constant higher than that of conventional $SiO_2$ (since a relative dielectric constant is often represented by k, this gate insulating film is referred to as a high-k film) has been actively performed around the world. It has been demonstrated that the tunnel current can be directly suppressed indeed by applying a high-k film to the gate insulating film of a transistor. However, it has been revealed that the mobility of a channel portion of the transistor (a region where a current flows in an ON state) is decreased with the use of a high-k film. The mobility represents a moving speed of a carrier in unit electric field, and its unit is $cm^2/Vs$. As is evident from the definition, a decrease in mobility causes deterioration of operation speed of the transistor. This is a critical defect in achieving performance enhancement of the transistor.

As described above, an object of scaling the transistor is to process more information at higher speed. However, if the mobility is decreased at the risk of introducing a new material, that is, a high-k film, and a processing speed is decreased, this is a case of the tail wagging the dog. Therefore, although there are needs in industries desiring to introducing a high-k film in view of power consumption, application of a high-k film to a gate insulating film has not yet been in actual use. Therefore, in such a situation that material development of a high-k film has not yet been completed, the use of a conventional $SiO_2$ film or an oxynitrided film (SION) obtained by adding nitrogen to $SiO_2$ has to be used continuously. That is, thinning the gate insulating film has to be frozen as a matter of practice, or proceeds at a significantly slow pace equal to or lower than approximately 1 angstrom for every several years. Since thinning the gate insulating film has played an extremely important role in pushing forward the scaling, the scaling of silicon semiconductor technology is in a crisis situation.

Therefore, new device technology developments with no depending on thinning of the gate insulating film have proceed. Since these technologies are not an extension of simple microfabrication, these are called technology boosters. Of such technology boosters, the one that should be noted is an approach of directly increasing the mobility of the silicon transistor. As described above, as the mobility is increased, the carrier moves faster and, as a matter of course, the processing speed of the field-effect transistor becomes faster by that amount.

One scheme for increasing the mobility is a strained-silicon transistor technology. The strained-silicon technology is a technology for increasing the mobility of the carrier by applying a strain to silicon.

Several schemes to apply a strain have been known. For example, in one scheme, by epitaxially growing silicon on silicon germanium epitaxially grown on a silicon substrate, tensile strain is applied to silicon, as shown in "J. Welser, Technical Digest of International Electron Device Meeting, 1994, pp. 373-376" (Non-Patent Document 1) and "N. Sugii, Technical Digest of International Electron Device Meeting, 2002, pp. 737-740" (Non-Patent Document 2). In another known scheme, by depositing a silicon nitride film as a liner film on a field-effect transistor, a compressive or tensile strain is applied to a channel portion, as shown in "F. Ootsuka, Technical Digest of International Electron Device Meeting, 2000, pp. 575-578" (Non-Patent Document 3). In still another known scheme, a compressive strain is applied to a channel portion by a strain caused by Shallow Trench Isolation used in device isolation, so that the hole mobility is increased, as shown in Non-Patent Document 3. In still another known scheme, as shown in "P. Bai, Technical Digest of International Electron Device Meeting, 2004, pp. 657-660" (Non-Patent Document 4), by epitaxially growing a silicon germanium in vicinity of a source-drain diffusion layer, a compressive strain is selectively applied to a channel portion of a p-type filed-effect transistor in parallel to a channel direction.

As described above, schemes of applying a strain through various manufacturing processes have been known. In any of these schemes, the mobility is increased to increase a driving current, thereby making it possible to exchange electrical charge within a shorter time and, as a result, an increase in processing speed is achieved.

Also, one technological scheme for increasing the driving current of the p-type field-effect transistor without special consideration of the manufacturing method, in which a <100> direction on a (100) substrate is taken as a channel direction, has been known, as shown in "H. Sayama, Technical Digest of International Electron Device Meeting, 1999, pp. 657-660" (Non-Patent Document 5).

Also, as technology booster other than that for increasing the driving current, a scheme using a transistor called FinFET having a three-dimensional structure, has been known, as shown in "D. Hisamoto, Technical Digest of International Electron Device Meeting, 1998, pp. 1032-1043" (Non-Patent Document 6). In the FinFET, by taking a finely-divided Silicon On Insulator called Fin as a channel portion, and interposing the Fin three-dimensionally between a gate insulating film and a gate electrode, a channel is formed on both sides of the Fin, and as a result, a short-channel effect is suppressed. With the use of the FinFET, further scaling is expected.

SUMMARY OF THE INVENTION

As described above, many suggestions as technologies for further microfabrication and performance enhancement of silicon semiconductor technologies have been proposed. However, to introduce these technologies, apparatuses with an extremely high price, such as an epitaxial growth apparatus, have to be introduced, so, there is a problem that an enormous amount of capital investment is required for mass production. Therefore, a technology that can achieve performance enhancement at low cost is desired.

Among the technologies described above, the one achievable at the lowest cost is the technology in which the <100> direction on the (100) substrate is taken as a channel direction. This means that a MOSFET is simply formed in a direction tilted by 45 degrees from a <110> direction normally used. To perform this, all what is required is to use a wafer with a notch on the (100) substrate oriented in the <100> direction. Since using such a wafer is easy, this technology has already been used at mass production sites.

However, as a matter of fact, the reason why the driving current is increased by using the <100> direction has not yet been academically clarified. Normally, an increase in driving current means an increase in mobility. However, it has been reported that the results of measurement of the mobility in the <100> direction in a MOSFET with a large channel length are identical to those in the <110> direction, in "H. Irie and A. Toriumi, Solid State Devices and Materials, 2004, pp. 724-725" (Non-Patent Document 7). Therefore, in at least the MOSFET with a large channel length, it has been revealed that the mobility in the <100> direction is approximately equal to the mobility in the <110> direction.

For device designing optimal for the driving current of the pMOSFET, the above-mentioned question has to be answered. Also, if the answer is obtained, more optimal device design for increasing the driving current of the pMOSFET at low cost is realized.

In addition, to improve the performance of the LSI, only improving the performance of the pMOSFET is insufficient. In modern LSIs, circuit is often configured with a CMOS (Complementary MOS), therefore, the performance of the nMOSFET has to be improved at the same time.

An object of the present invention is to provide a semiconductor device and its manufacturing method in which the driving current of a pMOSFET is increased with easily-formable scheme using existing silicon process.

First, a question why the driving current of the pMOSFET is increased only in a device with a short channel length but not in a device with a long channel length, is solved.

To solve this question, a MOSFET as shown in FIG. 1 was formed on a silicon substrate 1 with a normal (100) surface as a plane direction of a surface. The silicon substrate 1 used is based on normal specifications with a notch 2 being in a <110> direction for easiness of dicing a chip. Here, a crystal face and a direction are additionally described. In the present invention, a notation "the (100) surface" is not differentiated from equivalent surfaces, such as (010) and (001) surfaces, based on normal crystallographic classification. Similarly, the <100> direction is equivalent to the <010> and <001>. Also, it is needless to say, <110> is equivalent to <011> and <101>.

In the case where this (100) substrate with the <110> notch 2 is used, a device normally formed is a MOSFET in which the direction of a current flowing from a source diffusion layer 3 to a drain diffusion layer 4 is parallel to the <110> direction. This device is hereinafter referred to as a <110> channel device. In the <110> channel device, a channel length L is defined by a gate electrode 5. And, the channel width is defined by a width W of the source diffusion layer 3 and the drain diffusion layer 4. On a surface portion of the substrate 1 where no device exists, an insulator formed through Shallow Trench Isolation is buried, which is a normal configuration.

In addition to this <110> channel device, a MOSFET in a direction in which the <110> channel device is rotated by 45 degrees is formed. That is, in this MOSFET, the direction of the current flowing from a source diffusion layer 6 to a drain diffusion layer 7 is parallel to the <100> direction. In this <100> channel device, a gate electrode 8 is also oriented to a direction rotated by 45 degrees.

By forming the <110> channel device and the <100> channel device on the same substrate 1 in this manner, both devices can be compared with exactly the same manufacturing process. Also, although not shown in FIG. 1 for simplification, by forming a plurality of devices with different channel lengths L and channel widths W, difference between a long-channel device and a short-channel device can be clarified.

As a result, electrical characteristics as shown in FIG. 2 were obtained. On the left side of FIG. 2, a drain current-gate voltage characteristic of a short-channel device with L=0.12 μm is shown, and a graph inserted therein shows results plotted on a log scale. From these characteristics, it was confirmed that the current flowing in the <100> channel device is larger than that in the <110> channel device by 19%. This attests the conventional knowledge shown in Non-Patent Document 5, that is, as for the short-channel device, a larger driving current can be obtained from the <100> channel device than the <110> channel device.

On the other hand, in a mobility characteristic of a long-channel device with L=20 μm shown on the right side of FIG. 2, the difference between the <100> channel device and the <110> channel device is merely as slight as 5%. This attests the conventional knowledge shown in Non-Patent Document 7, that is, as for the long-channel device, the difference of a mobility between the <100> channel device and the <110> channel device is small.

Normally, if the channel length becomes shorter, influences of external resistance and velocity saturation become significant, and therefore the difference in driving current due to the difference in mobility is rather decreased. Therefore, such a difference as described above between the short-channel device and the long-channel device is extremely abnormal.

To find out a physical reason of this phenomenon, following points were examined. That is, if superiority of the <100> channel device occurs only in the short-channel device but no significant difference occurs in the long-channel device, either one of the following two should occur: (1) an exotic new physical phenomenon that is not noticeable until the channel length is shortened; and (2) there is a cause for increasing the mobility when the channel length is shortened.

As for (1), no specific example academically accepted is present. Therefore, if the possibility of (2) cannot be denied, a proposal of (1) cannot be accepted. Therefore, the possibility of (2) was considered. That is, the possibility that the mobility of the short-channel device is different from the mobility of the long-channel device was considered.

In exploring the cause of change in the mobility due to a decrease in channel length, it was found that as the channel length is shortened, a distance from an end of the source diffusion layer 3 or 6 to an end of the drain diffusion layer 4 or 7 is shortened. To make this point clear, a <100> channel device with a long channel is shown in FIG. 3. In FIG. 3, a distance represented by "d" corresponds to a distance from an STI adjacent to the end of a source diffusion layer 6 to an STI adjacent to the end of a drain diffusion layer 7. Although not shown, it is needless to say that the same goes for a <110> channel device. As the distance d between STIs is decreased, a compressive strain stress applied to the channel portion existing immediately under the gate electrode 8 is possibly increased. It is understandable that the mobility is increased with an increase in compressive strain.

However, in the conventional strain measuring apparatus, it is difficult to find a strain of the device in a nondestructive state. In destructive measurement in which a device is finely cut out, a strain is changed when the device is taken out, therefore, a subtle difference in strain cannot be detected. Therefore, a Raman measurement with an extremely high measurement sensitivity is performed.

The results are shown in FIG. 4. As the channel length is shortened, a Raman shift is increased. Thus, it was revealed for the first time that a compressive strain is increased indeed. It was also revealed that the drain current of the <100> channel device is larger than the current of the <110> channel device. That is, it was revealed for the first time that, as for the short channel, the reason for a larger driving current of the <100> channel device than that of the <110> channel device is an increase in mobility due to a difference in compressive strain applied by STI.

By this new matter, the importance of the compressive strain is re-recognized. And developments for a scheme for applying a compressive stress better than currently-known schemes have been done.

As one scheme of increasing the mobility of a pMOSFET, a method in which a one-axis compressive strain is applied in a direction parallel to the channel, as shown in Non-Patent Document 4, is known.

The reverse method, that is, a scheme of applying a one-axis compressive strain in a direction perpendicular to the channel, is tried. To do this, all what is required is to examine the mobility of a device with a narrow channel width W. However, it is usually difficult to measure the mobility if the channel width is narrow. Because, if the channel width is narrow, an effective region of the channel portion is decreased, thereby making it impossible to measure a capacitance.

To solve this problem, a device with a multi-channel configuration in which a plurality of channels with a narrow channel width W are coupled together as shown in FIG. 5 is formed. In FIG. 5, an example of a multi-channel MOSFET formed using a (100) substrate 11 having a notch 12 in the <100> direction is shown. The multi-channel MOSFET in FIG. 5 has five channels interposed by four STI units 16 under a gate electrode 15.

FIG. 6 shows the mobility of the device formed. For W=10 μm, an example of a normal pMOSFET with one channel is shown. On the other hand, for W=1 μm, a pMOSFET with ten channels, and for W=0.25 μm, a pMOSFET with 40 channels is formed respectively, so that a total of the effective widths of the each devices was adjusted to equal to 10 μm. Thus, a precise measurement of the mobility is realized for the first time.

As a result, it was revealed for the first time that, as for the <110> channel device, the mobility is hardly changed with an one-axis compressive strain being applied to a direction perpendicular to the channel as shown on the left side of FIG. 6, on the other hand, as for the <100> channel device, the mobility is increased as shown on the right side of FIG. 6. In particular, it was revealed that, although the compressive strain applied was on the order of 300 MPa, which is not so strong, an overwhelming effect was obtained such that the increment of mobility by approximately 30%.

Furthermore, as shown in FIG. 7, short-channel devices with different channel widths were formed to examine the driving current. As a result, it was demonstrated that an increase in driving current by as much as 65% at the maximum is available.

Therefore, it is revealed that, in order to increase the mobility of the pMOSFET, applying a compressive strain in a direction perpendicular to the channel is quite effective.

Based on these matters, a method of increasing the driving current of the pMOSFET is specifically disclosed in the following. In addition to a multi-channel MOSFET, a method of increasing the mobility by applying a strain to a FinFET is also disclosed. Furthermore, a scheme of increasing the driving current of an nMOSFET is disclosed at the same time.

According to the present invention, by using the existing semiconductor manufacturing apparatus without special capital investment, the driving current of the pMOSFET can be increased. Therefore, an LSI capable of high-speed processing at low cost can be provided.

DESCRIPTION OF THE PREFERRED EMBODIMENTS

Figure 1:
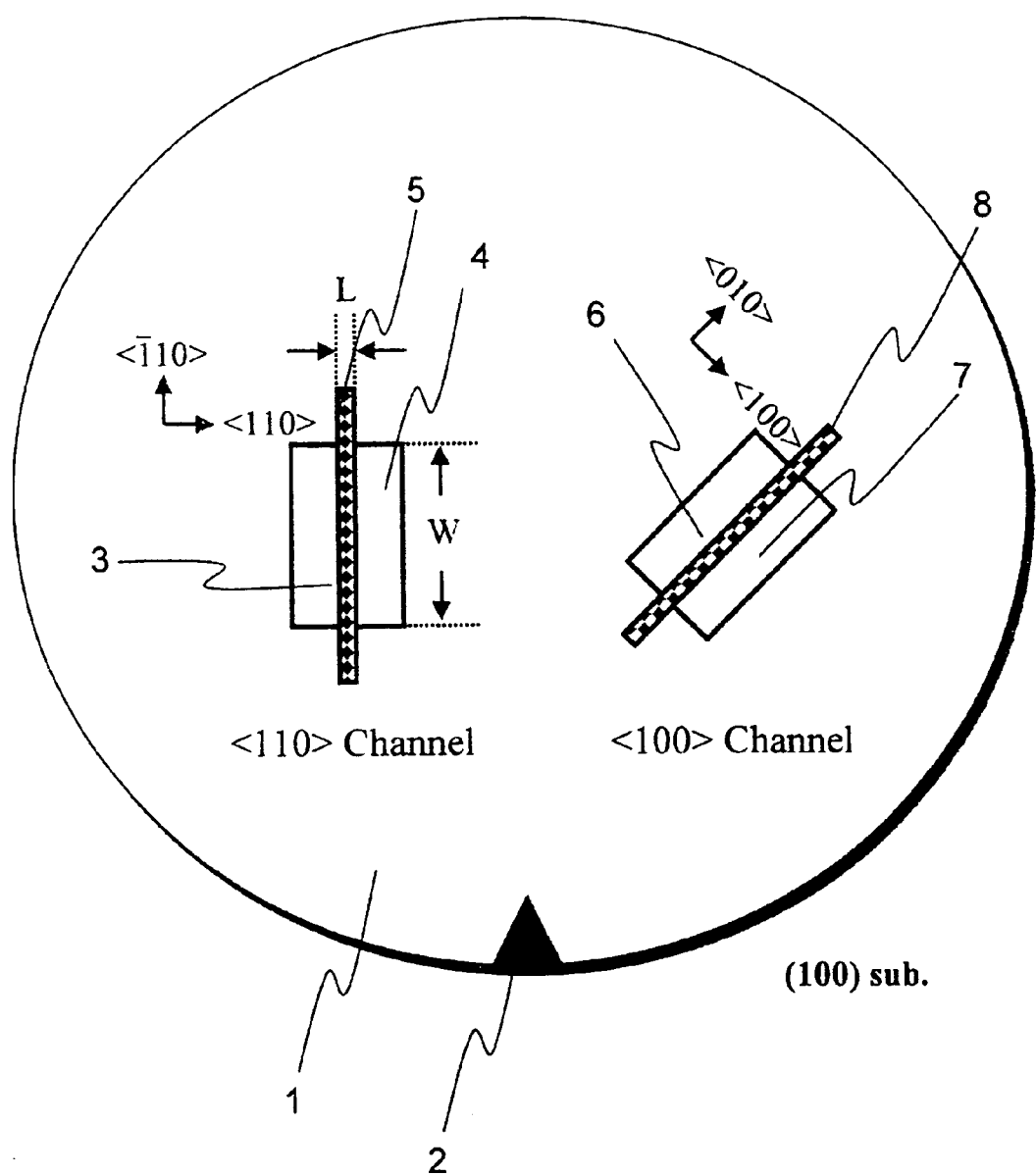
FIG. 1 is a schematic view of a short-channel device for explaining an experiment on which the present invention is based.
Figure 2:
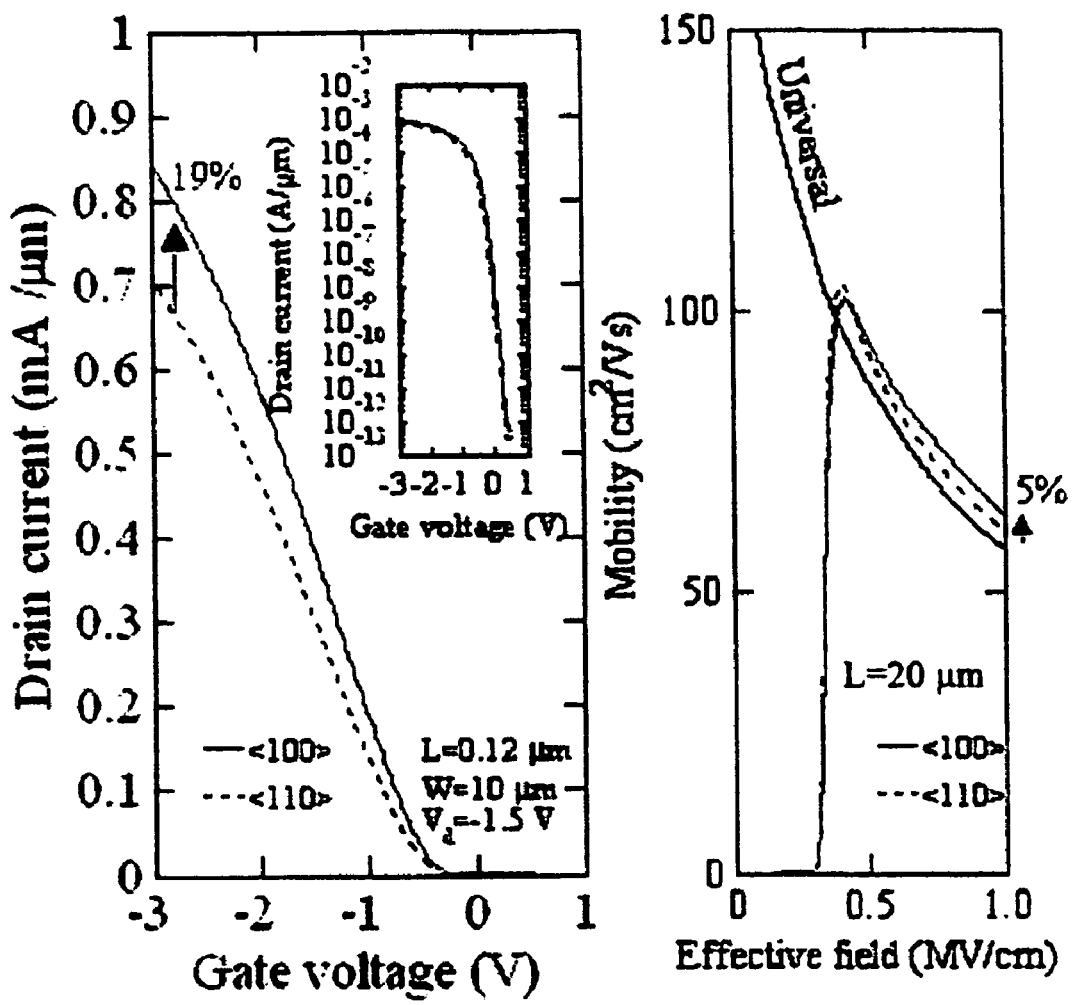
FIG. 2 shows experiment data on which the present invention is based.
Figure 3:
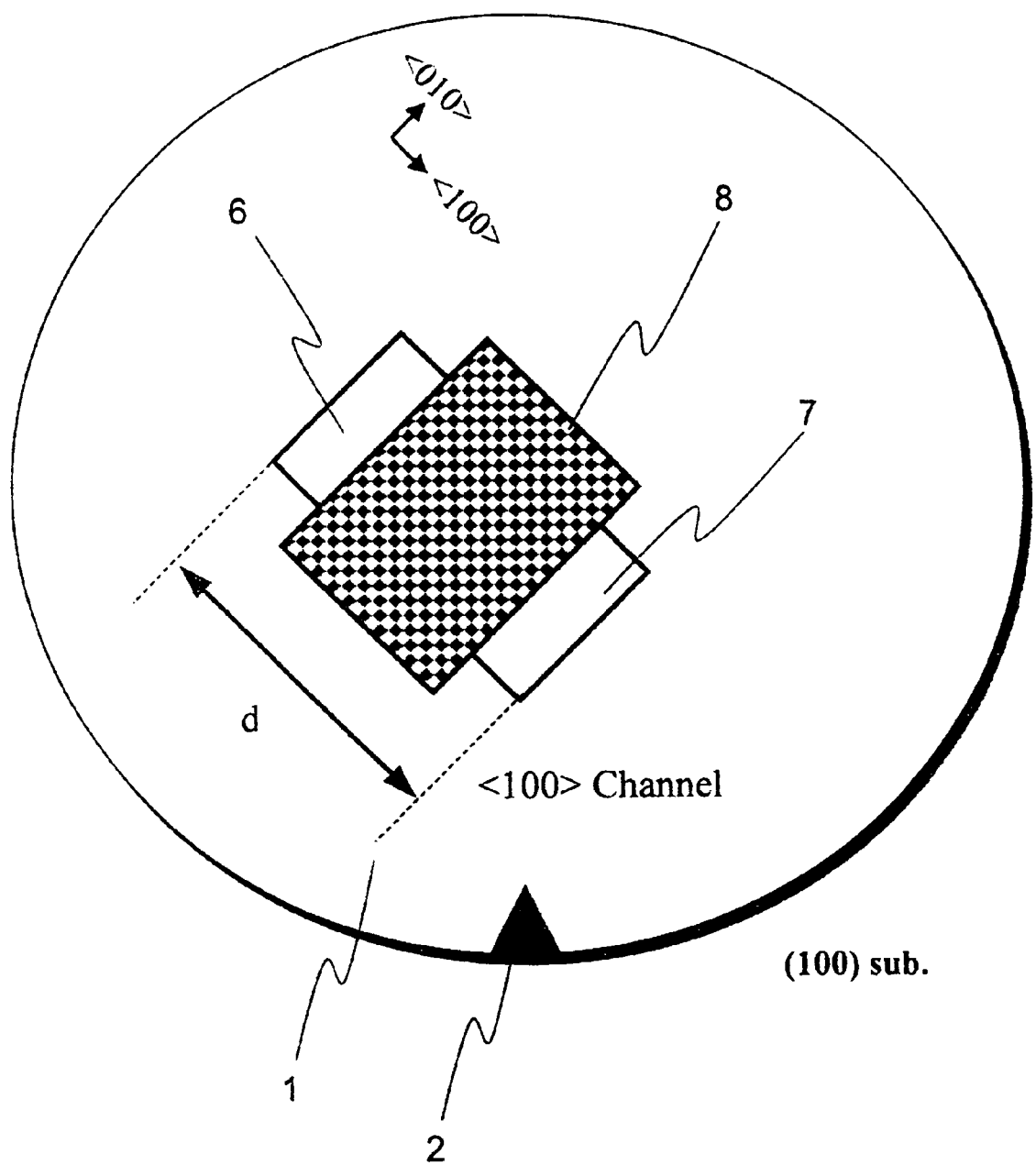
FIG. 3 is a schematic view of a long-channel device for explaining an experiment on which the present invention is based.
Figure 4:
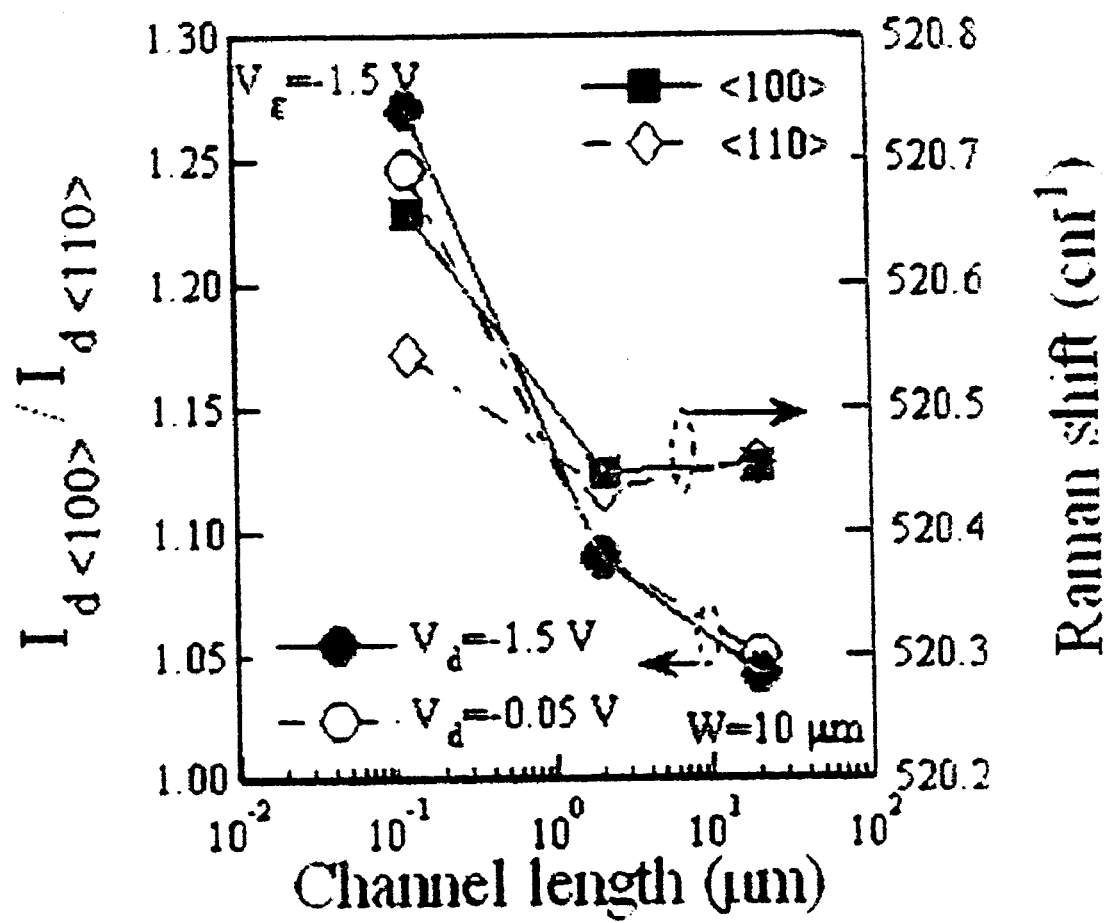
FIG. 4 shows experiment data on which the present invention is based.

Embodiments of the present invention are described in detail below based on the drawings. Here, in the drawings for description of the embodiments, components having the same function are provided with the same symbols, and are not repeatedly described herein. Also, it is needless to say that, other than the methods introduced in the embodiments, various changes are possible by, for example, changing combinations of materials and manufacturing processes.

First Embodiment

Figure 5:
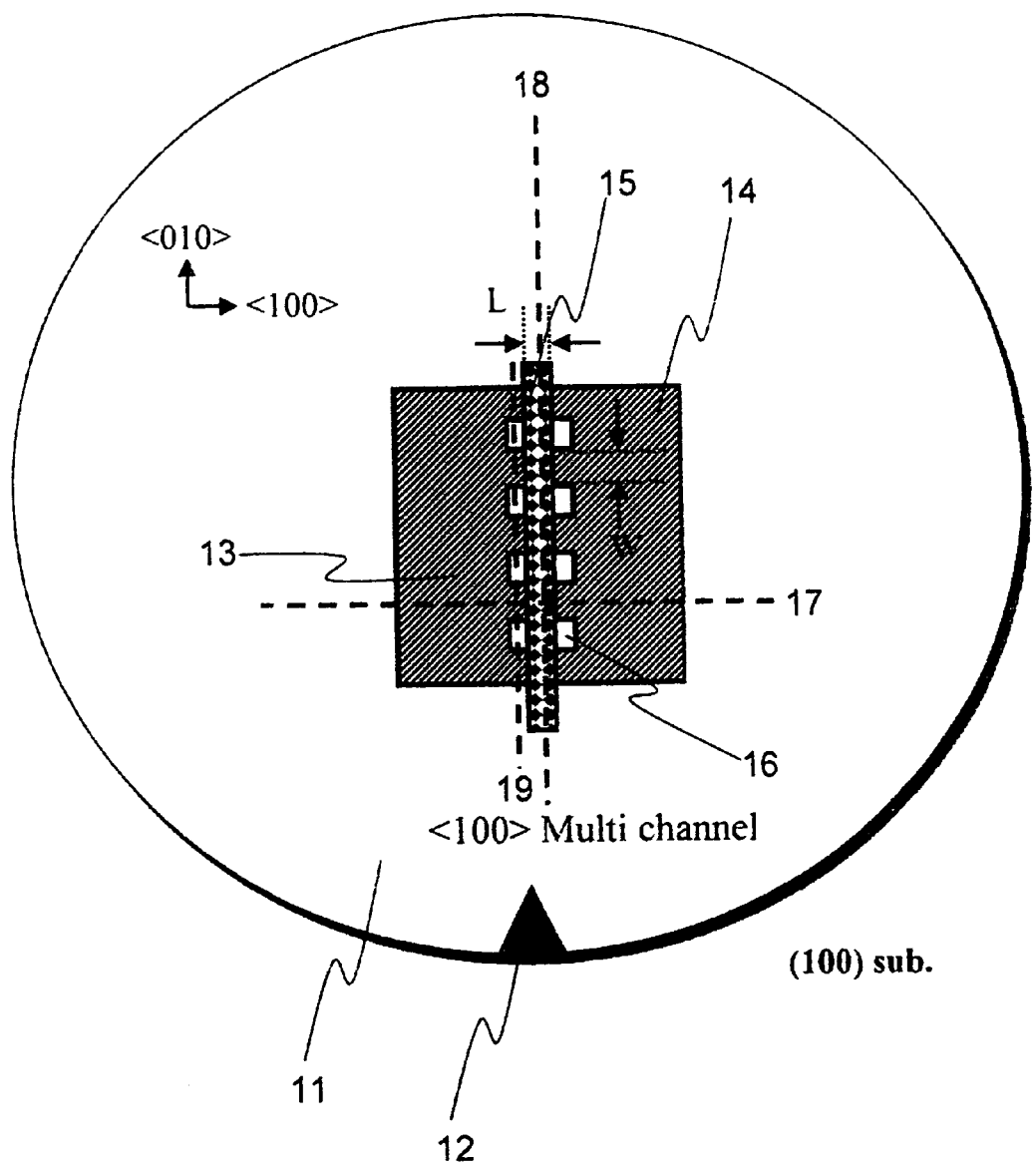
FIG. 5 is a schematic view of a transistor according to the first embodiment of the present invention.
Figure 6:
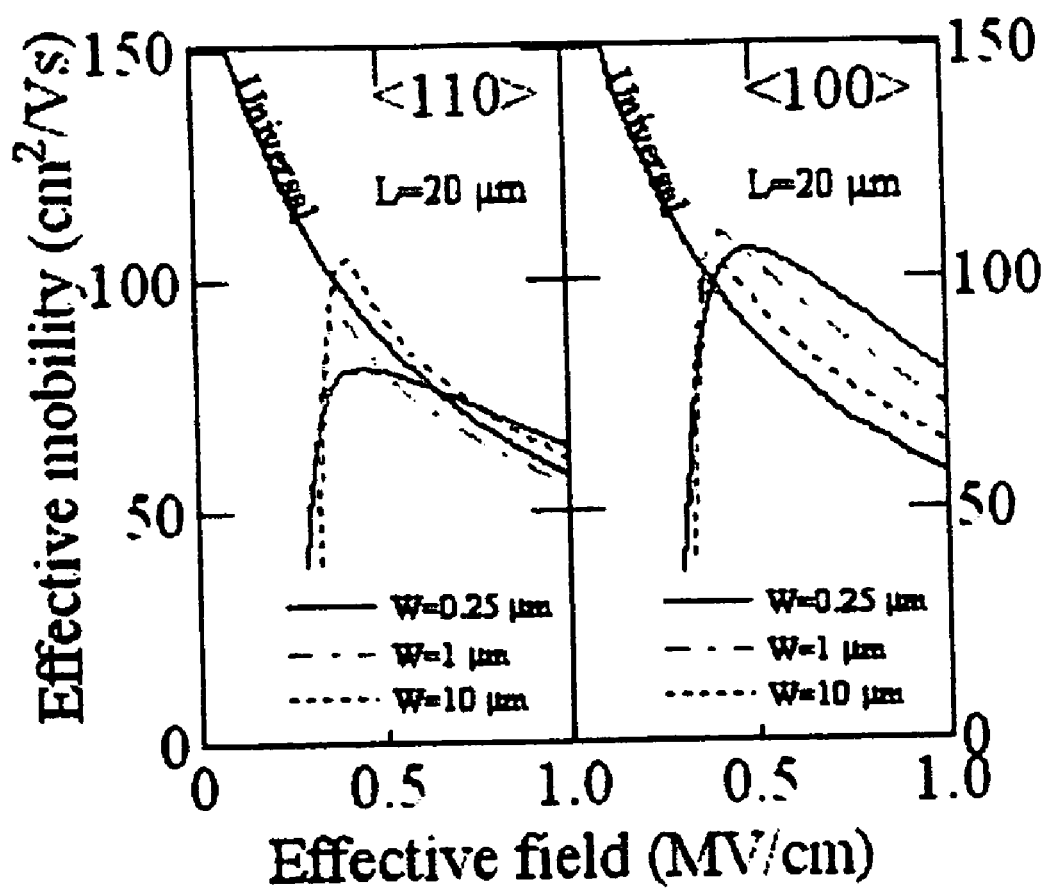
FIG. 6 shows experiment data on which the present invention is based.

In a first embodiment, a method of manufacturing a multi-channel pMOSFET having a channel in a <100> direction on a (100) substrate and capable of achieving a high mobility by applying a compressive distortion through an STI from a direction perpendicular to a channel is disclosed. FIG. 5 is a drawing of this device viewed from the top.

FIGS. 8A to 8D show a manufacturing process using sectional views along a section 17 in FIG. 5. FIGS. 9A to 9D show a manufacturing process using sectional views along a section 19 in FIG. 5. The process is described below in sequence.

First, a (100) substrate 11 having a notch 12 in a <100> direction is provided. As the (100) substrate 11, a substrate formed only of single crystal silicon, or an SOI substrate may be used. In a case where an SOI substrate is used, the SOI layer having a (100) surface with a notch 12 in the <100> direction can be used. Also, even if a normally mass-produced <100> substrate having the notch 12 oriented not in the <100> direction but in the <110> direction is used, it is needless to say that effects exactly the same as the following effects can be expected when the device itself is formed as being rotated by 45 degrees.

Next, the surface of the substrate 11 is oxidized to form a silicon oxide film 21 having a film thickness on the order of 100 nm on its surface. Then, a silicon nitride film 22 is deposited on the order of 100 nm to bring about a state shown in FIG. 8A and FIG. 9A.

Figure 8A:
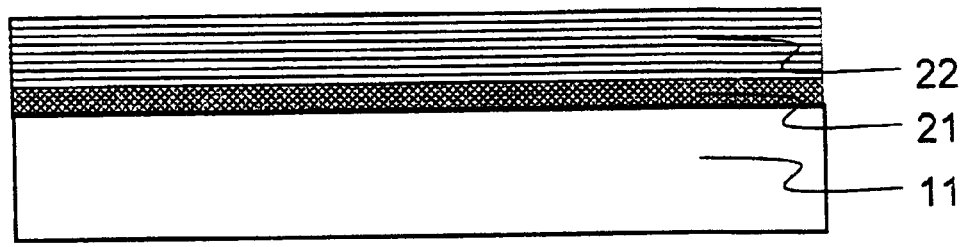
FIG. 8A is a cross-section view for depicting a transistor manufacturing process according to the first embodiment of the present invention.
Figure 8B:
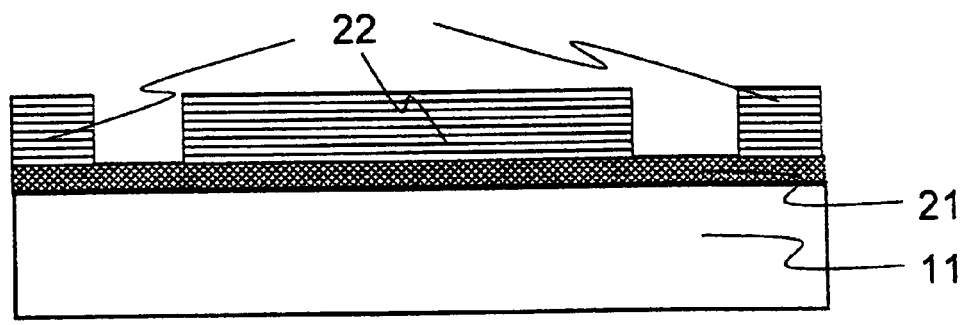
FIG. 8B is a cross-section view for depicting a transistor manufacturing process according to the first embodiment of the present invention.
Figure 9A:
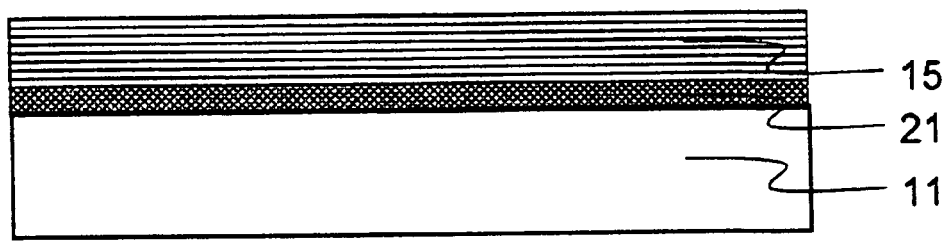
FIG. 9A is a cross-section view for depicting the transistor manufacturing process according to the first embodiment of the present invention.
Figure 9B:
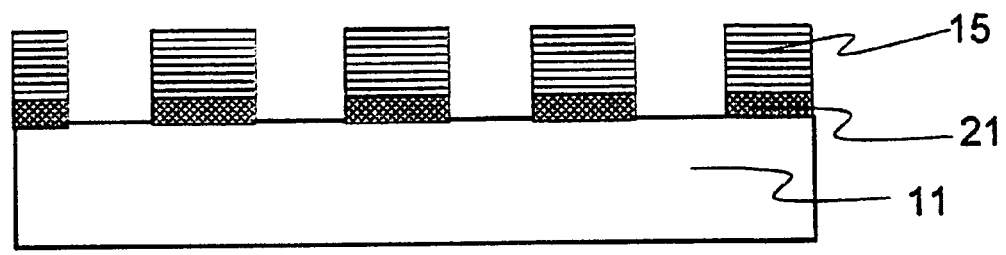
FIG. 9B is a cross-section view for depicting the transistor manufacturing process according to the first embodiment of the present invention.

Then, to process a desired region where an STI is to be formed, photolithography and dry etching are used to process a part of the silicon nitride film 22, thereby bringing about a state shown in FIG. 8B and FIG. 9B.

Figure 8C:
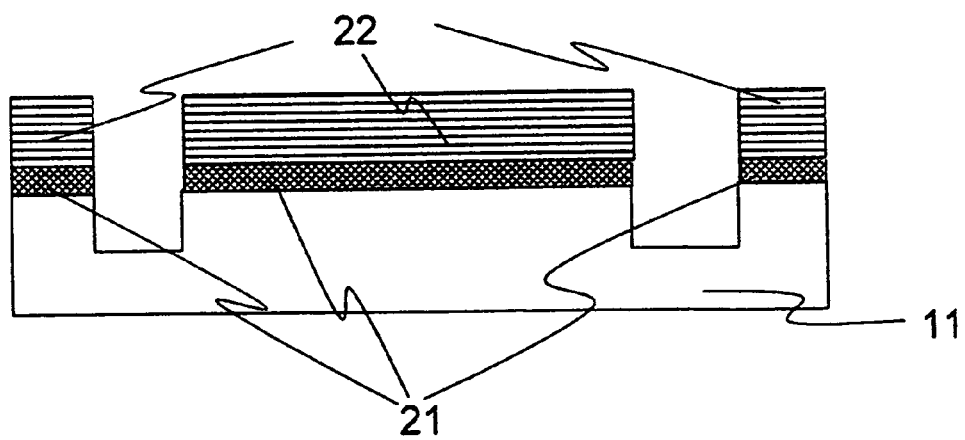
FIG. 8C is a cross-section view for depicting a transistor manufacturing process according to the first embodiment of the present invention.
Figure 9C:
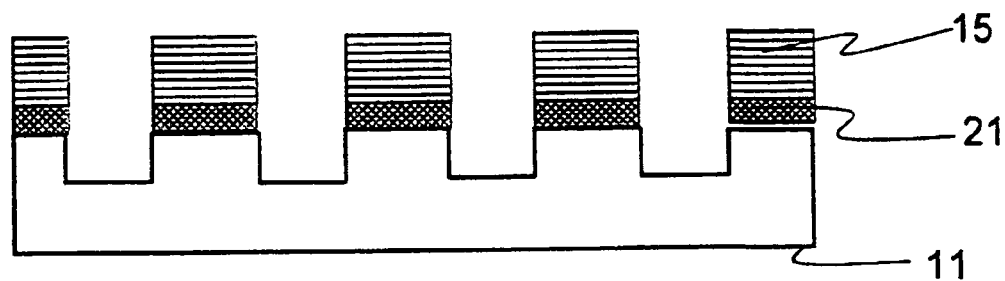
FIG. 9C is a cross-section view for depicting the transistor manufacturing process according to the first embodiment of the present invention.

Next, a part of the silicon oxide film 21 and a part of the silicon substrate 11 are removed through dry etching, thereby bringing about a state shown in FIG. 8C and FIG. 9C.

Figure 8D:
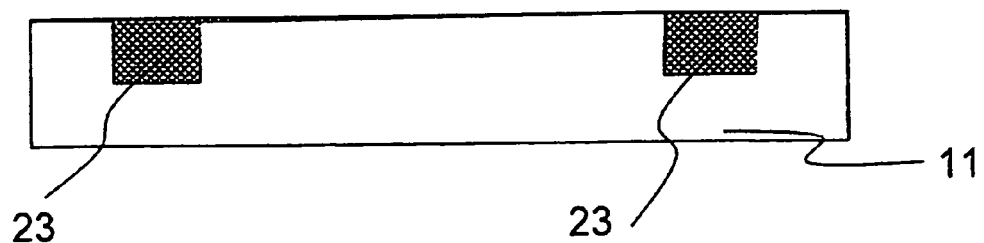
FIG. 8D is a cross-section view for depicting a transistor manufacturing process according to the first embodiment of the present invention.
Figure 9D:
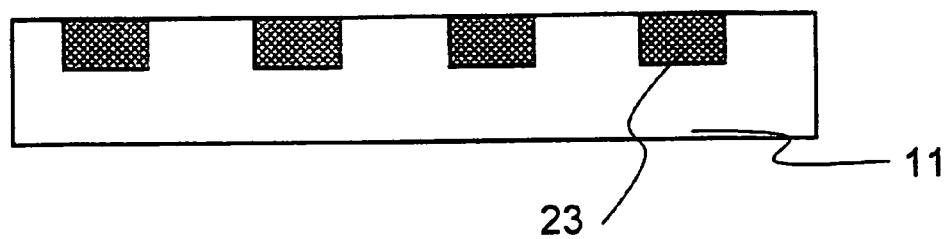
FIG. 9D is a cross-section view for depicting the transistor manufacturing process according to the first embodiment of the present invention.

Next, after a silicon oxide film is deposited all over the entire surface, the surface is planarized through Chemical Mechanical Polishing, and then silicon nitride film 22 and the silicon oxide film 21 are removed through wet etching, thereby bringing about a state shown in FIG. 8D and FIG. 9D where a buried insulating film 23 is formed. By this process, an STI is completed.

Here, as describe above, a deposited film of silicon dioxide for use in a normal silicon process can be used as the buried insulating film 23. If the mobility is further increased by particularly intensifying a compressive stress to be applied to the channel portion, it is effective to perform an oxidizing process after silicon buried once. In the latter case, the fact that a volume of the silicon is expanded to be approximately doubled at an oxidizing reaction of silicon to silicon dioxide is used, therefore, a more strong compressive strain can be applied. Also, by using a silicon nitride film as the buried insulating film 23, in place of a silicon oxide film, a stress control using an internal strain included in the silicon nitride film become possible.

Furthermore, another device isolation scheme may be performed in which, in the state in FIG. 8C and FIG. 9C, silicon is deposited after a deposition of silicon nitride, then, silicon in an NMOS formation region (not shown) is removed through photolithography and dry etching, after that, an oxidizing process is performed to the silicon deposited in a PMOS formation region to generate silicon dioxide; and then, after a silicon oxide film is further deposited on the entire surface, the silicon nitride film 22 and the silicon oxide film 21 are removed through chemical-mechanical polishing and wet etching. In this case, the buried insulating film 23 has a multilayered structure of the silicon nitride film and the silicon oxide film. As a result, a very strong compressive stress can be applied to the PMOS formation region, while no compressive stress is applied to the NMOS formation region. Furthermore, by controlling the stress of the silicon nitride film, even a tensile stress can be applied to the NMOS formation region.

In this manner, with variations on the buried insulating film 23, various stresses can be applied to a desired region.

Next, a method of forming a multi-channel pMOSFET in an active region devise-isolated by the formed STI is described.

Figure 12A:
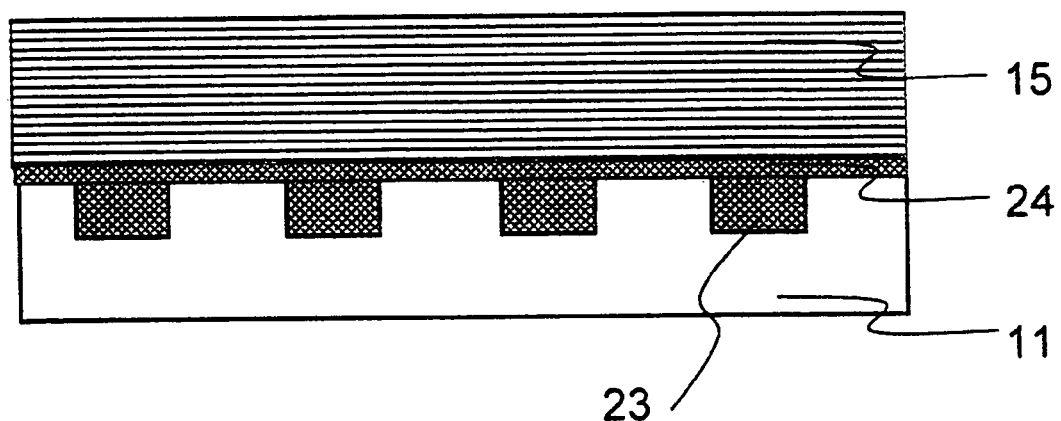
FIG. 12A is a cross-section view for depicting the transistor manufacturing process according to the first embodiment of the present invention.
Figure 12B:
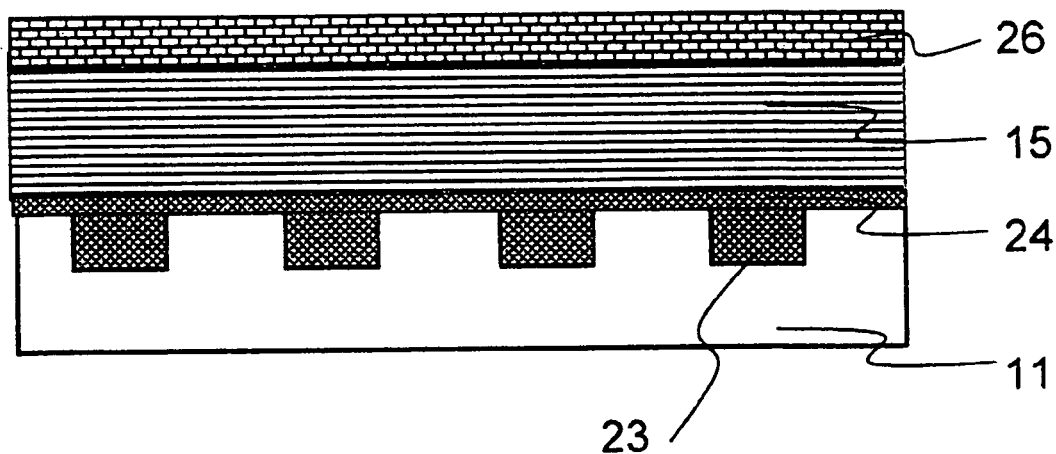
FIG. 12B is a cross-section view for depicting the transistor manufacturing process according to the first embodiment of the present invention.
Figure 13A:
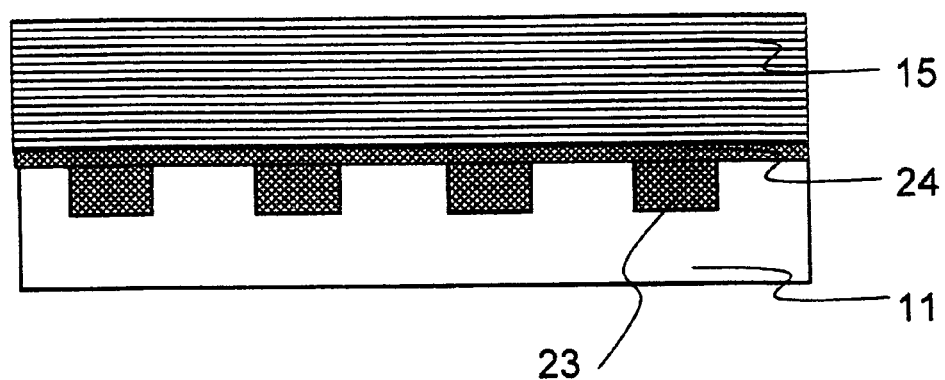
FIG. 13A is a cross-section view for depicting the transistor manufacturing process according to the first embodiment of the present invention.
Figure 13B:
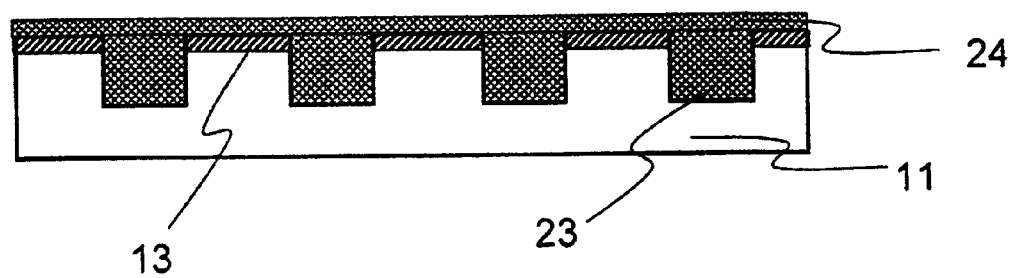
FIG. 13B is a cross-section view for depicting the transistor manufacturing process according to the first embodiment of the present invention.
Figure 13C:
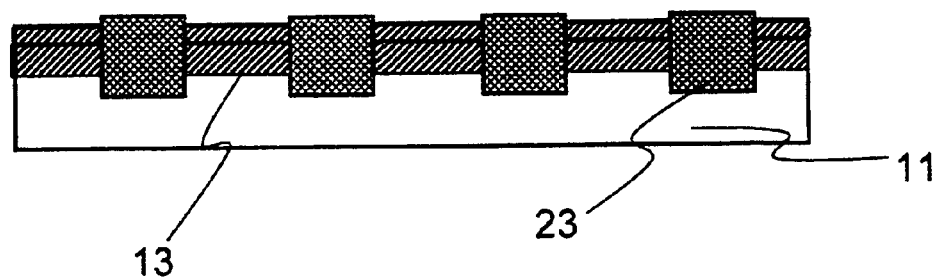
FIG. 13C is a cross-section view for depicting the transistor manufacturing process according to the first embodiment of the present invention.
Figure 13D:
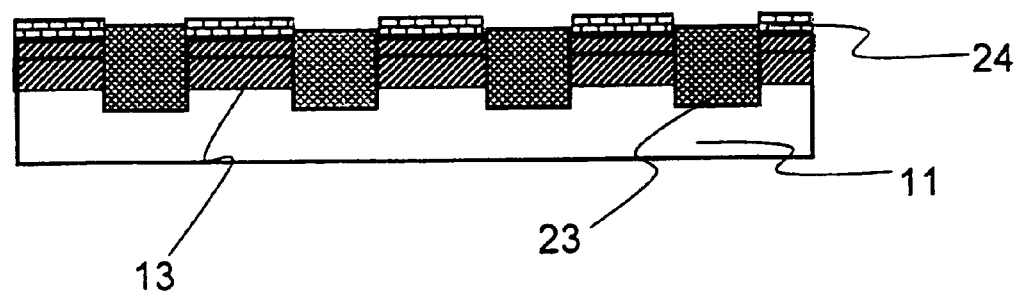
FIG. 13D is a cross-section view for depicting the transistor manufacturing process according to the first embodiment of the present invention.

FIGS. 10A to 10D and FIGS. 11A and 11B show a manufacturing process using sectional views along the section 17 in FIG. 5. FIGS. 12A to 12B show a manufacturing process using sectional views along a section 18 in FIG. 5. FIGS. 13A to 13D show a manufacturing process using sectional views along a section 19 in FIG. 5. The process is described below in sequence.

First, the surface of the substrate 11 is subjected to a cleaning process for cleaning. Then, a gate insulating film 24 is formed. As the gate insulating film 24, whether silicon dioxide formed by oxidizing the surface of the silicon substrate, a silicon oxynitride film subjected to a nitriding process, or a high-dielectric-constant gate insulating film with a larger relative dielectric constant can be used. In the present embodiment, a silicon dioxide film having a film thickness of 2.5 nm is used as the gate insulating film. Then, a polycrystalline silicon gate electrode 15 is deposited on the entire surface, thereby bringing about a state shown in FIGS. 10A, 12A, and 13A.

Figure 10A:
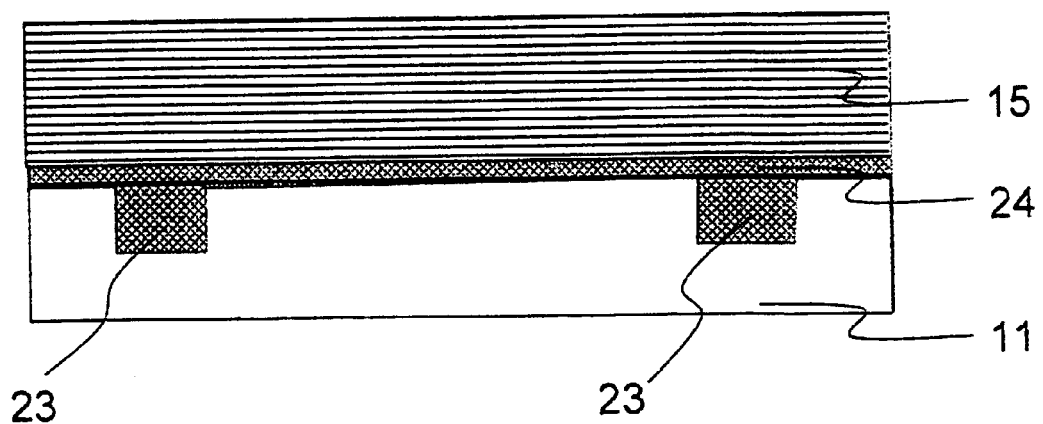
FIG. 10A is a cross-section view for depicting the transistor manufacturing process according to the first embodiment of the present invention.
Figure 10B:
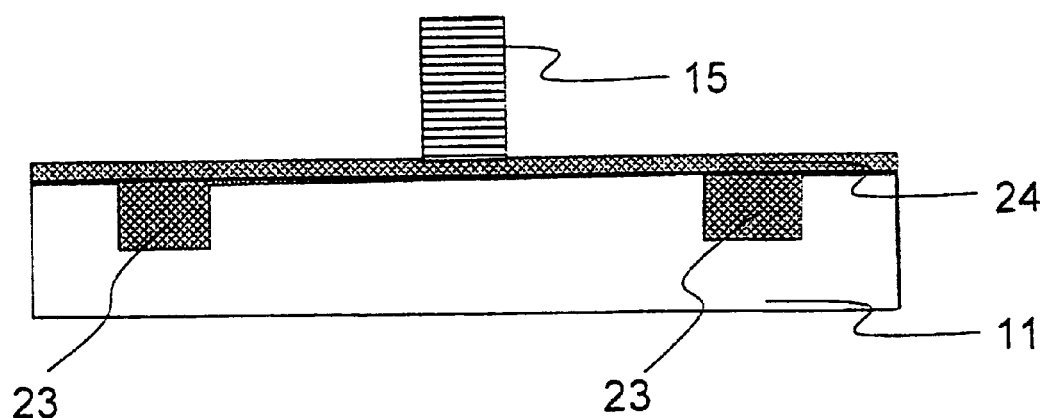
FIG. 10B is a cross-section view for depicting the transistor manufacturing process according to the first embodiment of the present invention.
Figure 10C:
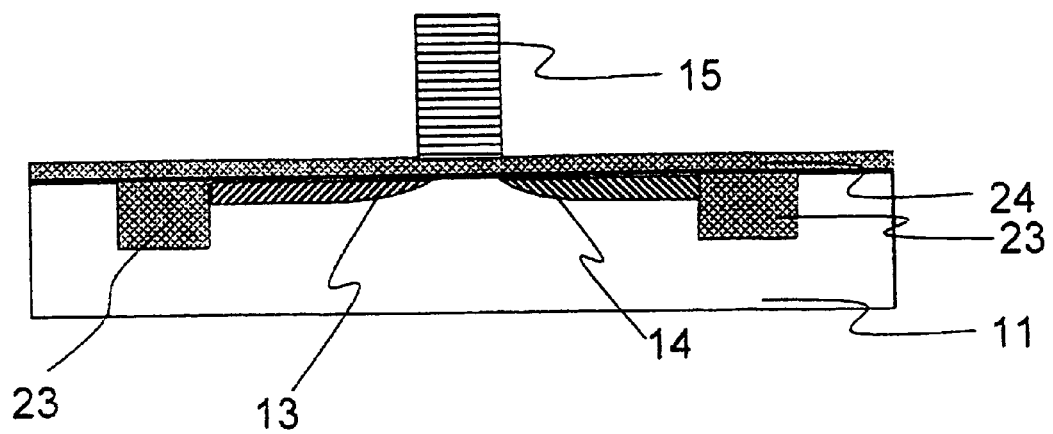
FIG. 10C is a cross-section view for depicting the transistor manufacturing process according to the first embodiment of the present invention.
Figure 10D:
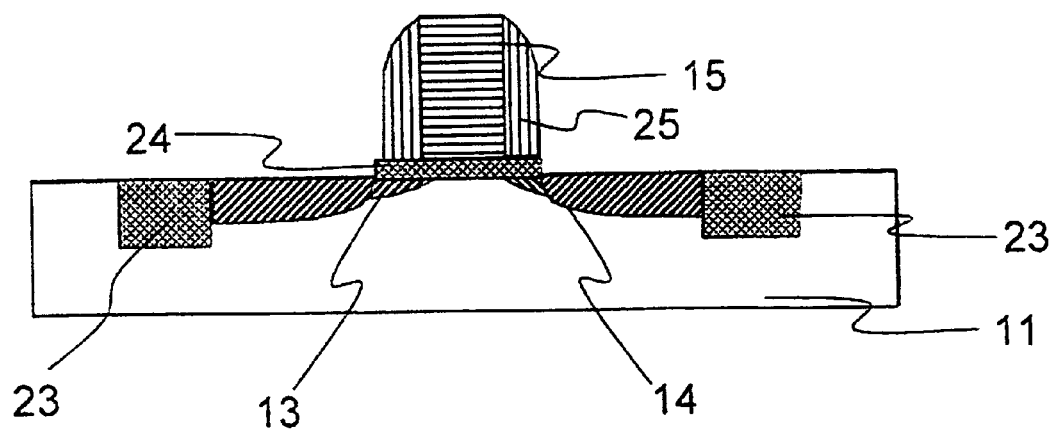
FIG. 10D is a cross-section view for depicting the transistor manufacturing process according to the first embodiment of the present invention.
Figure 11A:
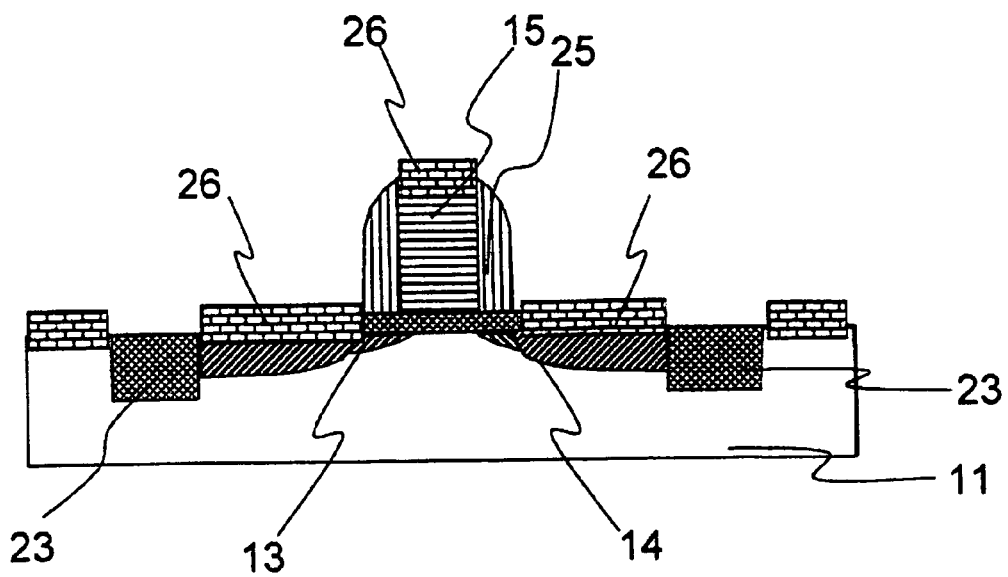
FIG. 11A is a cross-section view for depicting the transistor manufacturing process according to the first embodiment of the present invention.
Figure 11B:
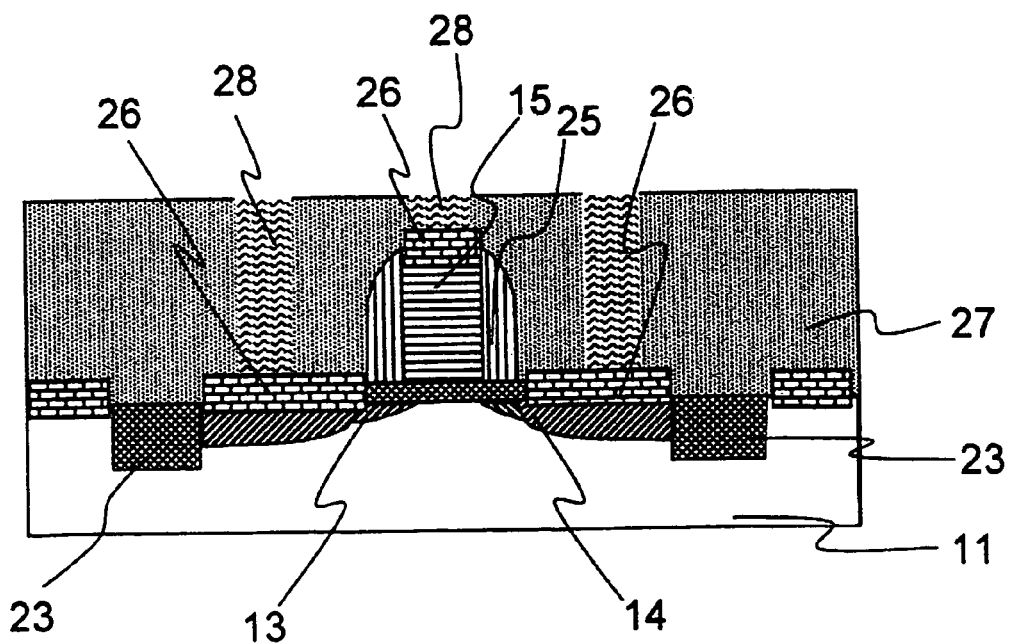
FIG. 11B is a cross-section view for depicting the transistor manufacturing process according to the first embodiment of the present invention.

Then, by using photolithography and dry etching, the polycrystalline silicon gate electrode 15 is processed to a desired shape, thereby bringing about a state shown in FIG. 10B.

Next, shallow ion implantation is performed on the PMOS formation region. Then, after an appropriate time is elapsed, activating annealing is performed at 1000° C., and a source diffusion layer 13 and a drain diffusion layer 14 are formed, thereby bringing about a state shown in FIG. 10C and FIG. 13B.

Next, after a silicon oxide film is deposited on the entire surface, anisotropic dry etching is performed. With this, the silicon oxide film is selectively left only on side walls of the polycrystalline silicon gate electrode 15 to form side walls 25, thereby bringing about a state shown in FIGS. 10D and 13C.

Next, in order to perform a SALICIDE (Self-Aligned-siLICIDE) process, a Ni film is deposited thinly on the entire surface through spattering, then, siliciding through annealing is performed, and then a non-reacted portion of the Ni film is removed through a wet process to left a Ni silicide film selectively on a silicon-exposed portion. Then, a Ni silicide film 26 is subjected to a resistance-reduce process through a short-time heat treatment, thereby bringing about a state shown in FIG. 11A and FIG. 12B to form a p-type multi-channel MOSFET. In the SALICIDE process, in place of Ni, another metal material, such as Co, can be used. Then, after an interlayer film 27 is deposited on the entire surface, the surface is planarized through chemical-mechanical polishing. Then, desire openings are formed to fabricate wiring metals 28, thereby bringing about a state shown in FIG. 11B. If more complicated wirings are required, a wiring process can be performed a plurality of times.

Figure 7:
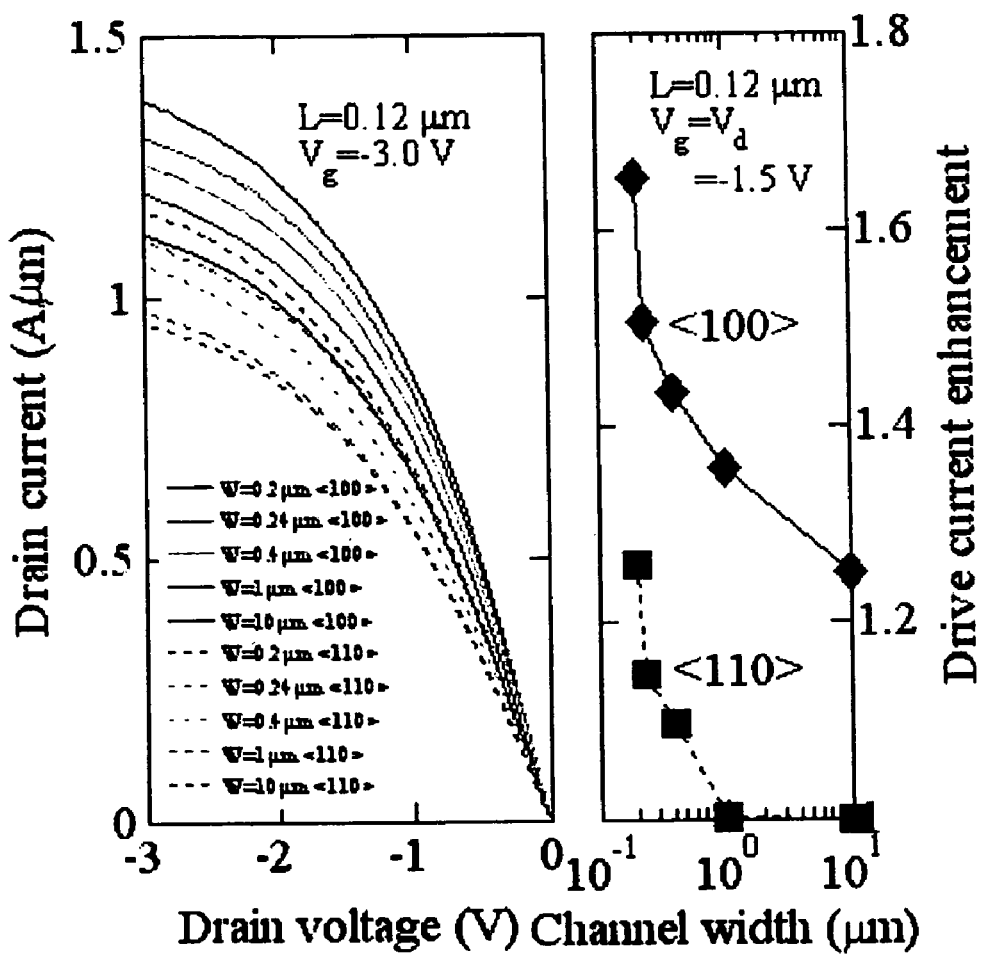
FIG. 7 shows results of improvement of transistor characteristic according to the first embodiment of the present invention.

In the characteristic of thus formed device, the driving current is significantly increased by 65% at the maximum compared with the conventional driving current, as shown in FIG. 7. Effects of such an extremely large driving current far exceed a restriction in layout that the transistors with a thin channel width have to be coupled together. In fact, a switching speed of a transistor is often represented by CV/I where C is a capacitance, V is a voltage, and I is a driving current, and it does not depend on the channel width W. Therefore, it can be said that the increase in driving current of 65% due to the increase in mobility directly provides an improvement in switching speed.

Figure 29:
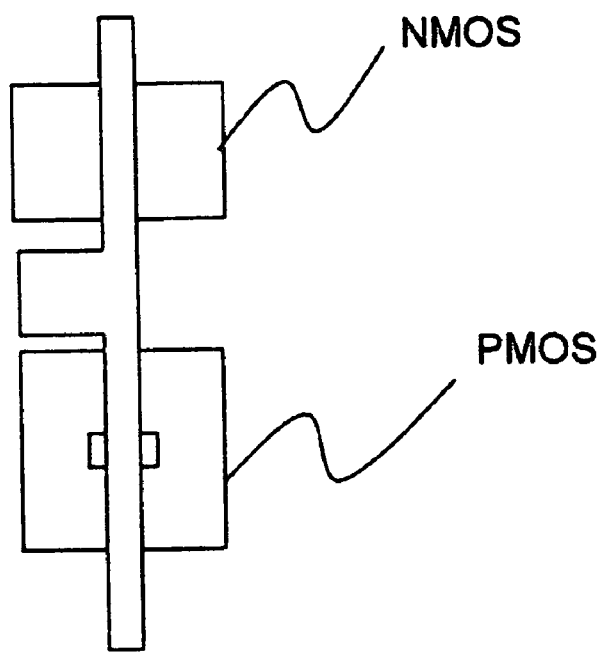
FIG. 29 is a mask layout depicting an inverter arrangement according to the first embodiment of the present invention.
Figure 30:
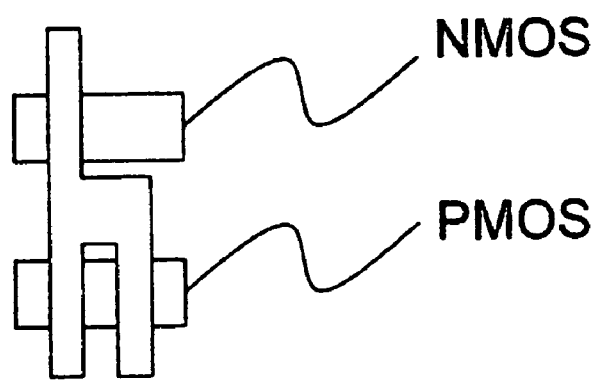
FIG. 30 is a mask layout depicting another inverter arrangement according to the first embodiment of the present invention.
Figure 31:
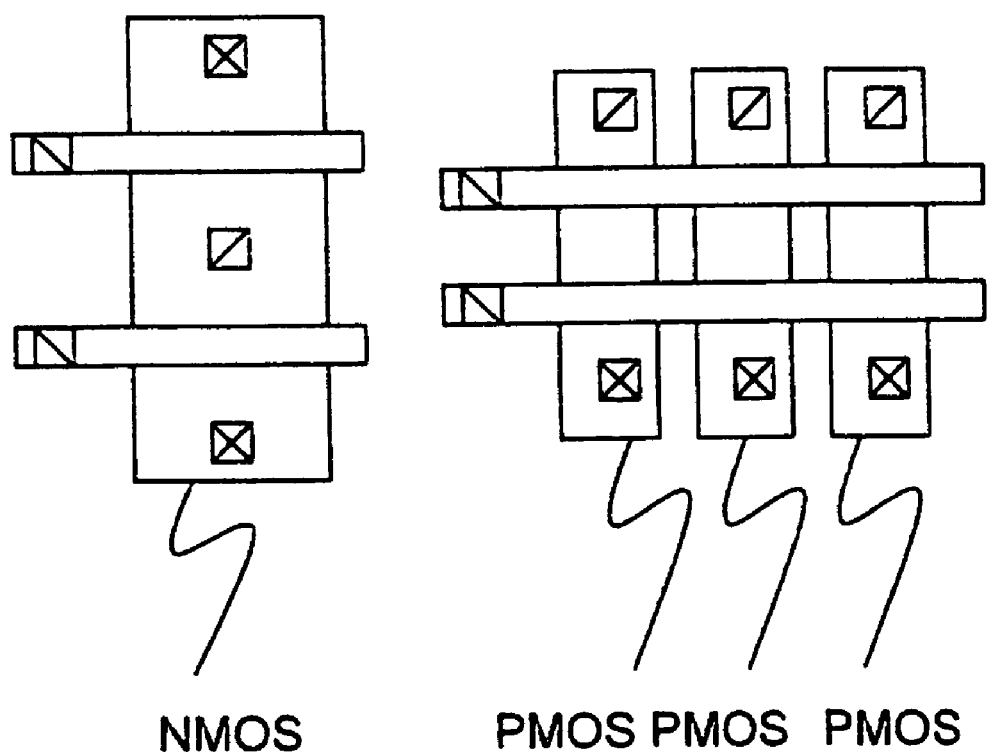
FIG. 31 is a mask layout depicting an NAND gate arrangement according to the first embodiment of the present invention.

A current ULSI is configured with a CMOS inverter as a basic gate. This is because the CMOS inverter includes an NMOS and a PMOS operating in a complementary manner, therefore, operations can be performed with an extremely low power. An CMOS inverter, which is basic element, is configured by one NMOS and one PMOS. However, since the NMOS and the PMOS have different current driving powers, the gate width of the PMOS is set longer than that of the NMOS, that is, doubled, so as to obtain an equal current driving power. According to the present invention, by forming a PMOS with a multi-channel PMOS, a large current driving power can be obtained. So, to widen the gate width, it is effective to divide the PMOS into plural in layout, as shown in FIG. 29. Also, by dividing the gate of the PMOS as shown in FIG. 30 to form a multi-channel, the total gate width can be increased. In this case, by taking a diffusion layer interposed by the divided gates as a drain side, the drain diffusion layer can be decreased and a parasitic capacitance can be reduced. An example in which the present invention is applied to a NAND gate with two CMOS inverters combined together is shown in FIG. 31. In the drawing, portion laid out in squares represent contacts. Contacts with crossed lines in the square represent contacts to a power supply and a ground wiring, and contacts with a diagonal line from upper right to left below represent contacts serving as output terminals. Furthermore, contacts each with a diagonal line from upper left to lower right represent contacts to a gate electrode.

Second Embodiment

In a second embodiment, based on the knowledge, leading to the present invention, as for the <100> channel, by applying a compressive strain in a direction perpendicular to the channel, the mobility of the pMOSFET is increased, a method of increasing the mobility in a multi-channel Fin-type FET is disclosed. The FinFET has a self-aligned-type double-gate configuration in which a side wall portion of an SOI formed in a fin shape like a shark's dorsal fine is taken as a channel. Therefore, as for the pMOSFET, it can be recognized easily that a stress pressing the fin from above is effective. In the present embodiment, a method of achieving the above with a film stress of a silicon nitride film is disclosed. And, for a CMOS operation, an increase in driving current of an NMOS is indispensable. As for the NMOS, two-dimensionally straining the side surfaces of the fin is most effective in increasing the mobility. Therefore, a strong tensile strain exceeding a compressive strain applied to the PMOS has to be applied. In the present embodiment, a method is disclosed in which, in the multi-fin configuration, after filling silicon among a plurality of fins, an oxidizing process is performed, so that the side walls of the fin are pressed extremely hard to apply a tensile stress in a fin plane.

FIGS. 14A to 14C, FIGS. 15A and 15B, and FIGS. 16A to 16B are schematic drawings viewed from a section of the channel portion of the multi-channel FinFET to show a manufacturing process based on the present embodiment. Also, FIGS. 17A to 17C, FIGS. 18A to 14C, and FIGS. 19A and 19B are schematic drawings viewed from a section on the gate to show the manufacturing process. Furthermore, FIGS. 20A and 20B, FIGS. 21A and 21B, FIGS. 22A and 22B, and FIGS. 23A and 23B are schematic drawings viewed from an upper side of the substrate to show the manufacturing process. The process is described below in sequence.

Figure 14A:
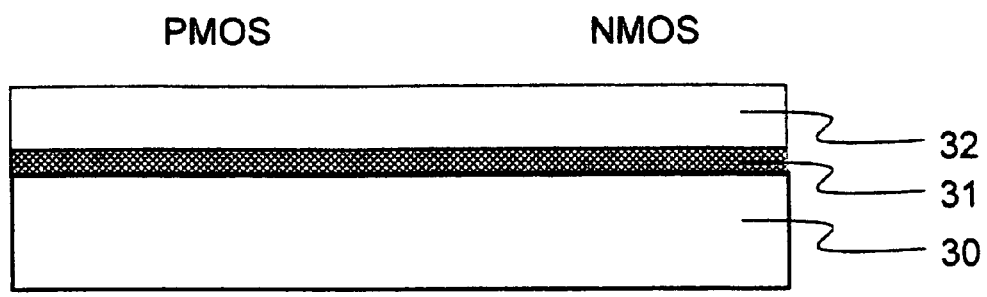
FIG. 14A is a cross-section view for depicting a transistor manufacturing process according to the second embodiment of the present invention.
Figure 17A:
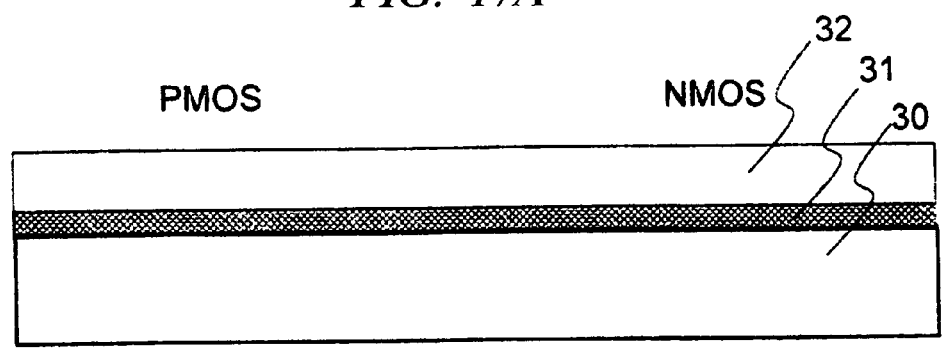
FIG. 17A is a cross-section view for depicting the transistor manufacturing process according to the second embodiment of the present invention.
Figure 20A:
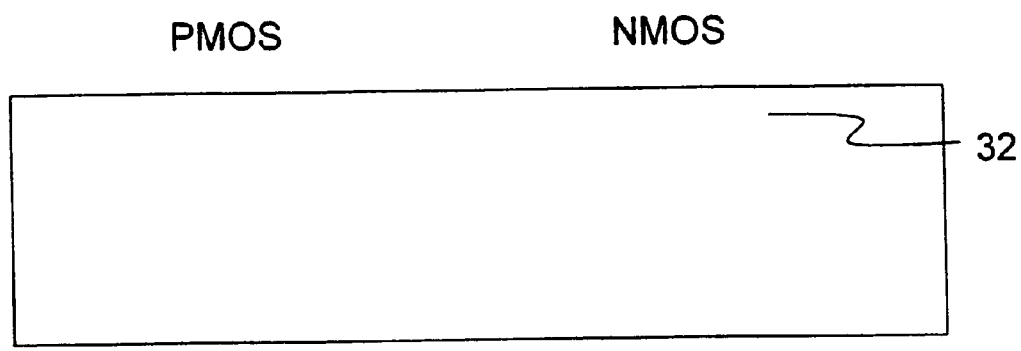
FIG. 20A is a cross-section view for depicting the transistor manufacturing process according to the second embodiment of the present invention.

Firstly, a (100) SOI substrate having a notch 12 in a <100> direction is provided. This SOI substrate have a BOX layer (Buried Oxide layer, a buried oxide film layer) 31 as a supporting substrate formed on single-crystal silicon substrate 30, and furthermore, SOI layer having a notch 12 in the <100> direction is formed on BOX layer 31, as shown in FIG. 14A, FIG. 17A, and FIG. 20A. To manufacture this SOI substrate, a laminating scheme or a SIMOX (Separation by IMplanted OXygen) scheme may be taken. With such a substrate, all the side walls and the upper surface of the fin can be the (100) surfaces. Such (100) surfaces have the highest electron mobility, and in addition, by controlling the <100> direction and the compressive strain, hole mobility can be increased.

Figure 14B:
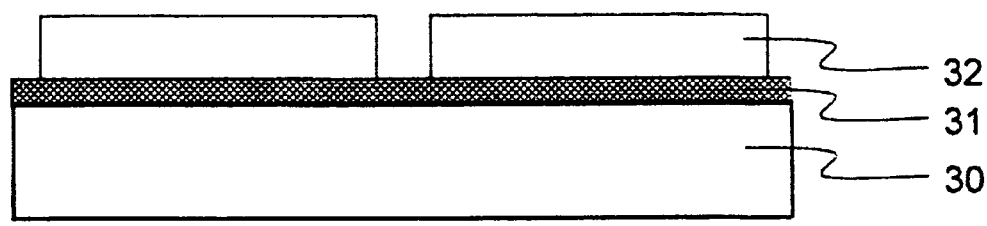
FIG. 14B is a cross-section view for depicting a transistor manufacturing process according to the second embodiment of the present invention.
Figure 14C:
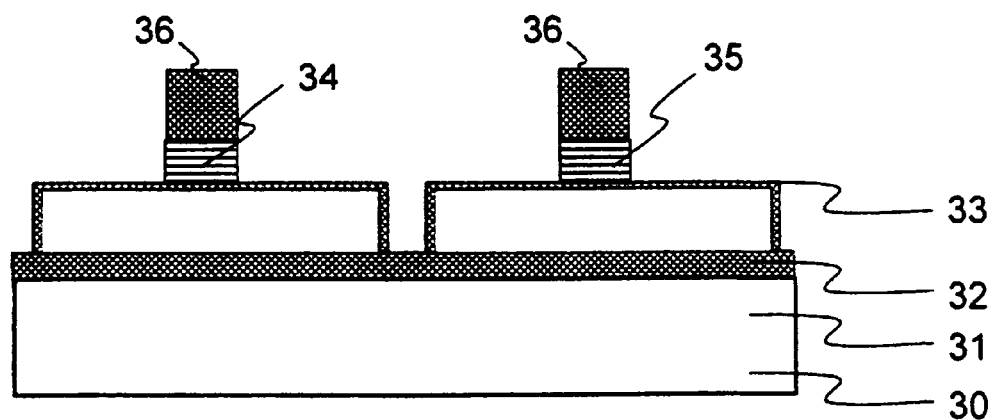
FIG. 14C is a cross-section view for depicting a transistor manufacturing process according to the second embodiment of the present invention.
Figure 17B:
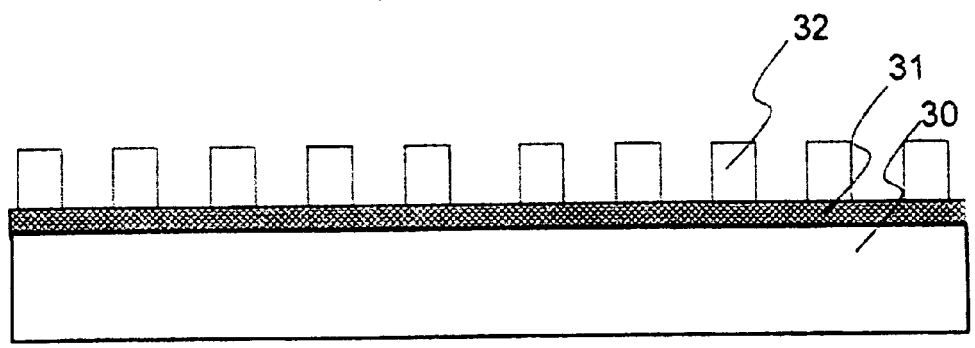
FIG. 17B is a cross-section view for depicting the transistor manufacturing process according to the second embodiment of the present invention.
Figure 17C:
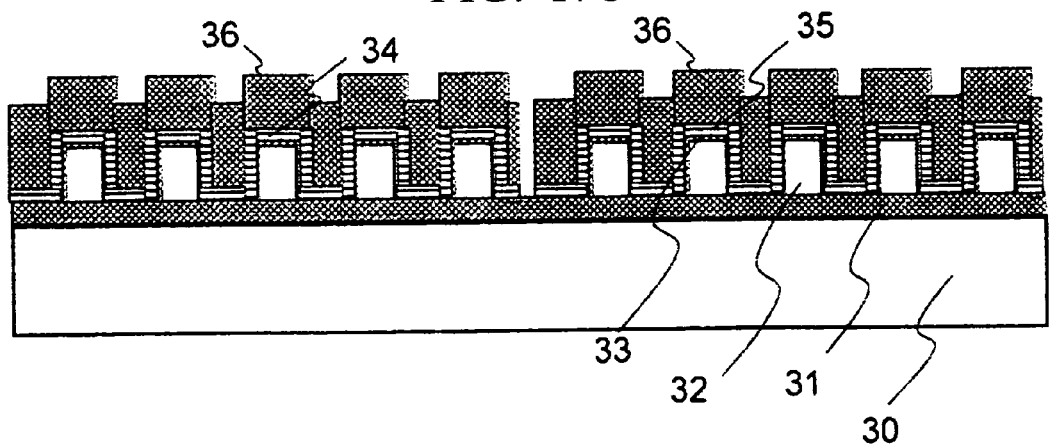
FIG. 17C is a cross-section view for depicting the transistor manufacturing process according to the second embodiment of the present invention.
Figure 20B:
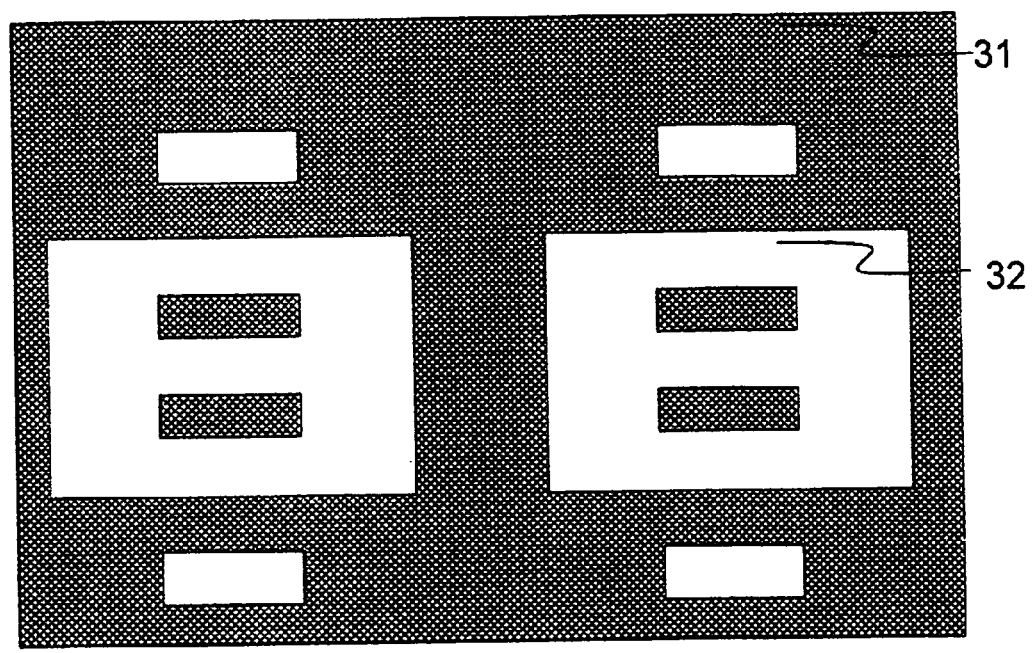
FIG. 20B is a cross-section view for depicting the transistor manufacturing process according to the second embodiment of the present invention.

Next, the SOI layer 32 is processed in a fin shape through photolithography and dry etching, thereby bringing about a state shown in FIG. 14B, FIG. 17B, and FIG. 20B. Here, fins at both ends of a PMOS shown in FIG. 17B and an NMOS shown in FIG. 20B are inserted as dummies so as to ensure the stability of the configuration even under application of a strain. Therefore, although a multi-Fin FET having three channels is shown in the drawings of the present embodiment, no problem occurs even if the number of fins may be more or less.

Next, after the surface is subjected to a cleaning process for cleaning, a gate insulating film 33 is formed. As the gate insulating film 33, silicon dioxide formed by oxidizing the surface of the silicon substrate, a silicon oxynitride film subjected to a nitriding process, or a high-dielectric-constant gate insulating film with a larger relative dielectric constant can be used. In the present embodiment, a silicon dioxide film having a film thickness of 2.0 nm is used as the gate insulating film. Then, a polycrystalline silicon gate electrode of 30 nm and a silicon dioxide hard mask of 100 nm are deposited on the entire surface and to processed through photolithography and dry etching into a PMOS polycrystalline silicon gate electrode 34, an NMOS polycrystalline silicon gate electrode 35, and a silicon dioxide hard mask 36, thereby bringing about a state shown in FIGS. 14C, 17C, and 21A.

Next, using a resist mask, B is ion-implanted in a PMOS region, and P is ion-implanted in an NMOS region. Then, after an appropriate time is elapsed, activating annealing is performed at 1000° C., and then a source diffusion layer 37 and a drain diffusion layer 38 are formed on the PMOS region, and a source diffusion layer 39 and a drain diffusion layer 40 are formed on the NMOS region, thereby bringing about a state shown in FIG. 15A.

Note that, the fins at both ends used as dummies are, in an electrical sense, not directly connected to the source diffusion layers 37 and 39 and the drain diffusion layers 38 and 40. Therefore, a current does not flow directly, but capacitive coupling exists. At ion implantation, ion implantation may be performed on the fins at both ends used as dummies, but the parasitic capacitance is preferably as small as possible.

Figure 15A:
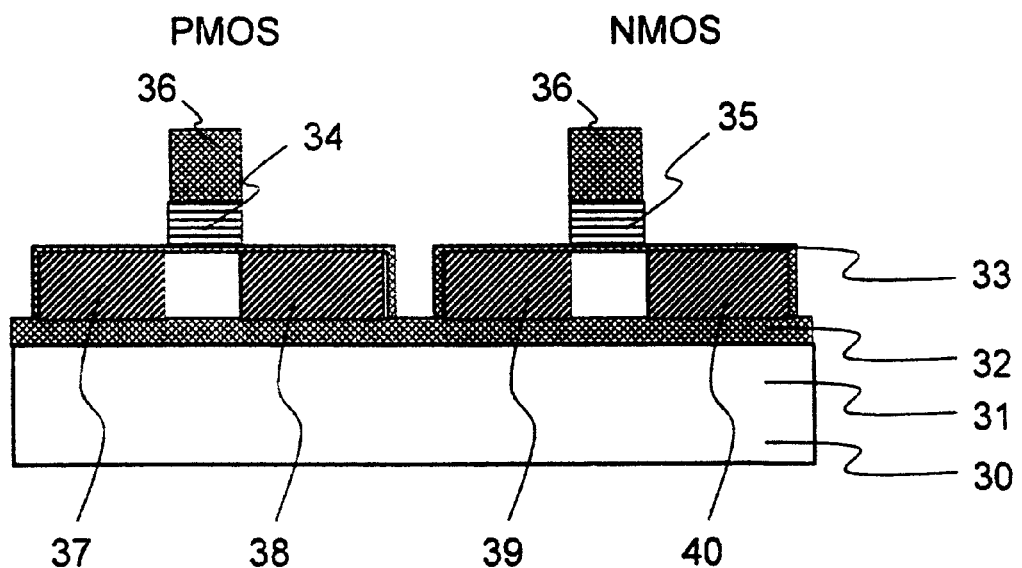
FIG. 15A is a cross-section view for depicting the transistor manufacturing process according to the second embodiment of the present invention.
Figure 15B:
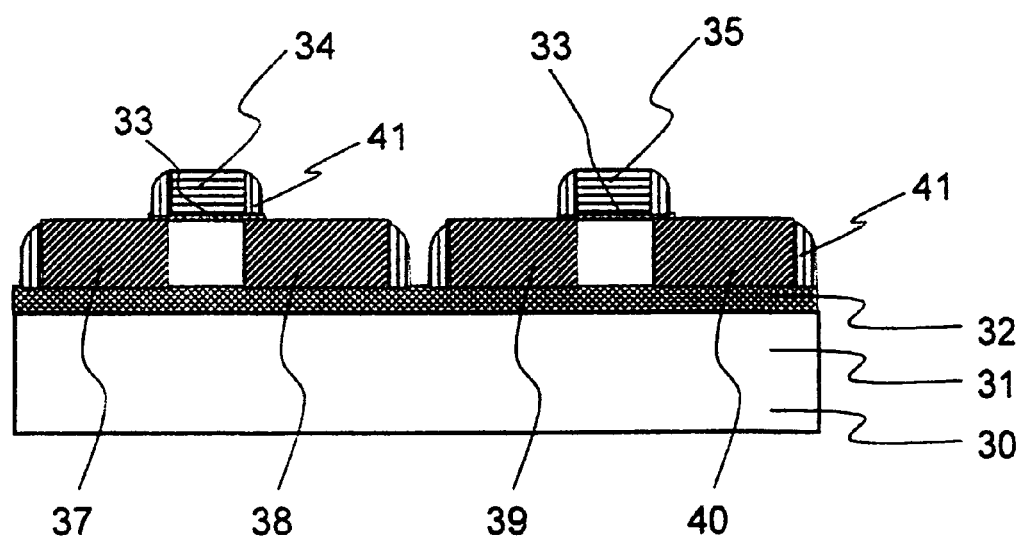
FIG. 15B is a cross-section view for depicting the transistor manufacturing process according to the second embodiment of the present invention.
Figure 18A:
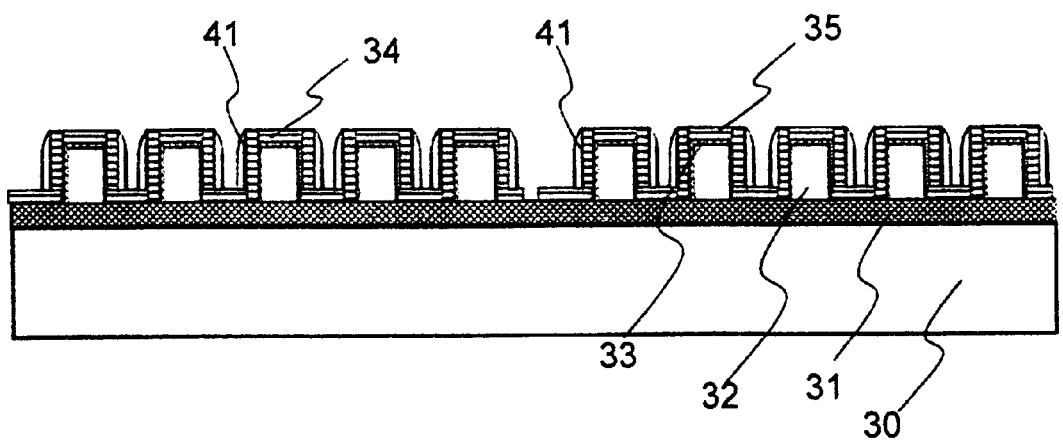
FIG. 18A is a cross-section view for depicting the transistor manufacturing process according to the second embodiment of the present invention.
Figure 21A:
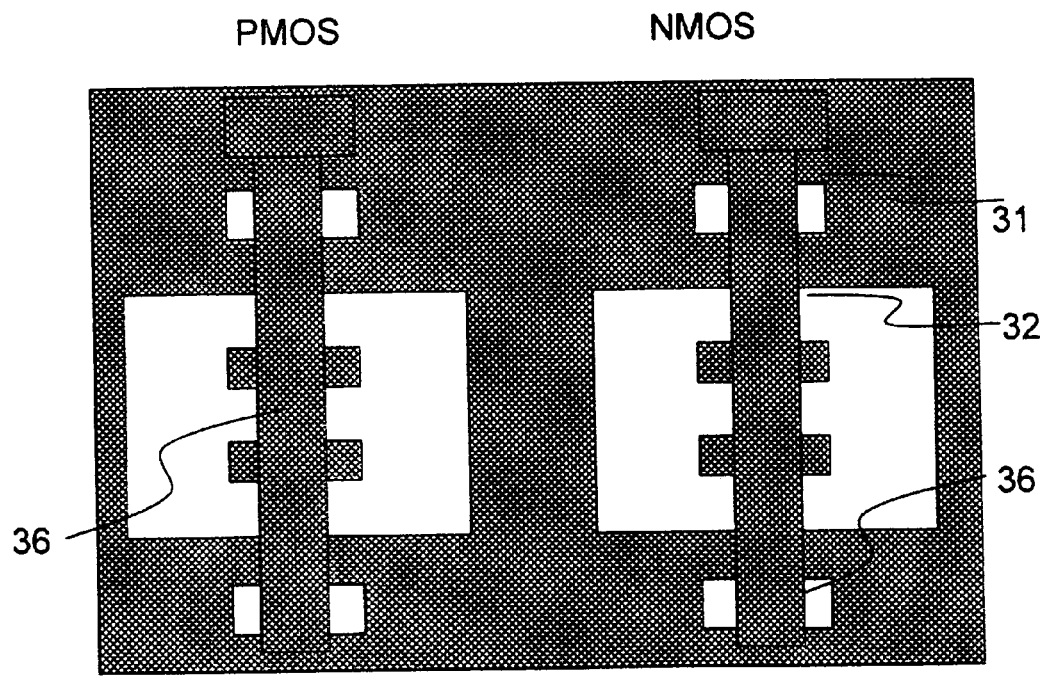
FIG. 21A is a cross-section view for depicting the transistor manufacturing process according to the second embodiment of the present invention.
Figure 21B:
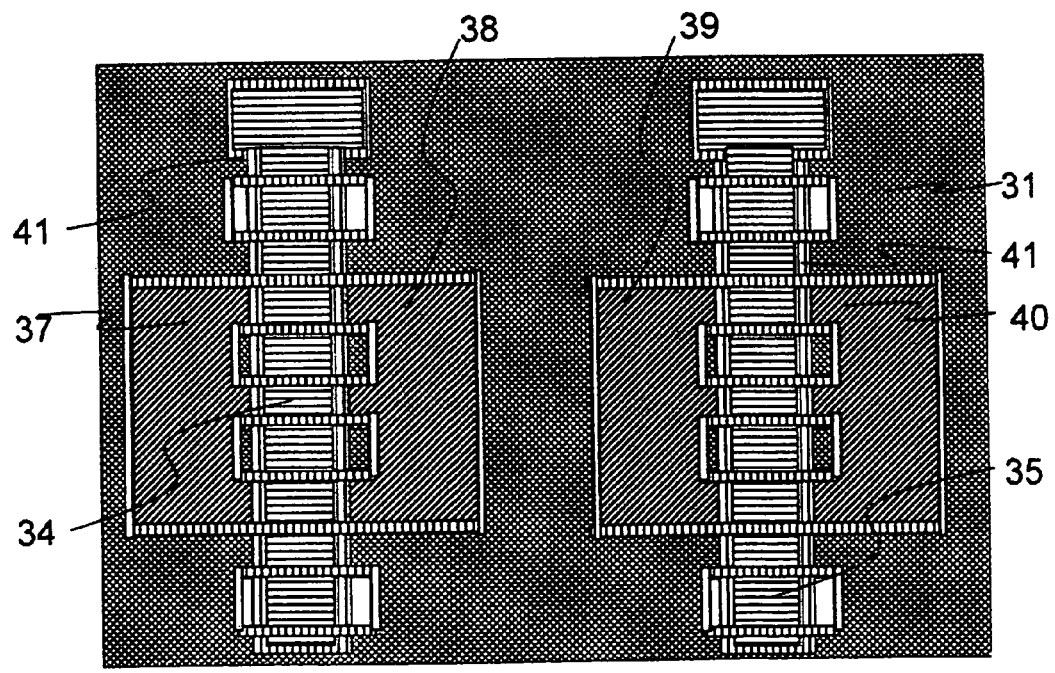
FIG. 21B is a cross-section view for depicting the transistor manufacturing process according to the second embodiment of the present invention.

Next, after the silicon dioxide hard mask 36 is removed through dry etching, silicon dioxide is deposited on the entire surface, and anisotropic dry etching performed so as to form side walls 41 deposited on side walls of the PMOS polycrystalline silicon gate electrode 34, and the NMOS polycrystalline silicon gate electrode 35, thereby bringing about a state shown in FIG. 15B, FIG. 18A, and FIG. 21B.

Figure 18B:
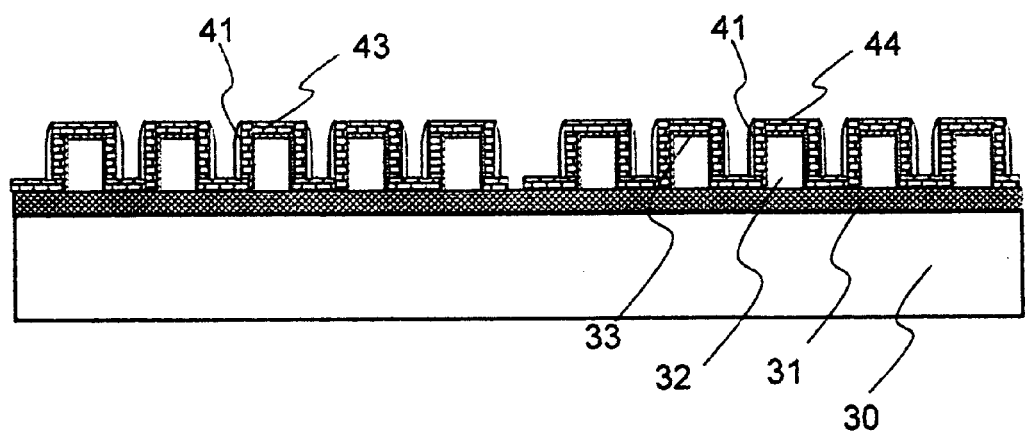
FIG. 18B is a cross-section view for depicting the transistor manufacturing process according to the second embodiment of the present invention.

Next, a Ni film is thinly deposited on the entire surface through spattering, and siliciding through annealing is performed, and then non-reacted portion of the Ni film is removed through a wet process to left a silicide film selectively on a silicon-exposed portion. Then, a Ni silicide film is subjected to a resistance-reduce process through a short-time heat treatment to form a PMOS complete silicide gate electrode 43, an NMOS complete silicide gate electrode 44, and diffusion layer silicide 42, thereby bringing about a state shown in FIG. 16A, FIG. 18B, and FIG. 22A.

Figure 16A:
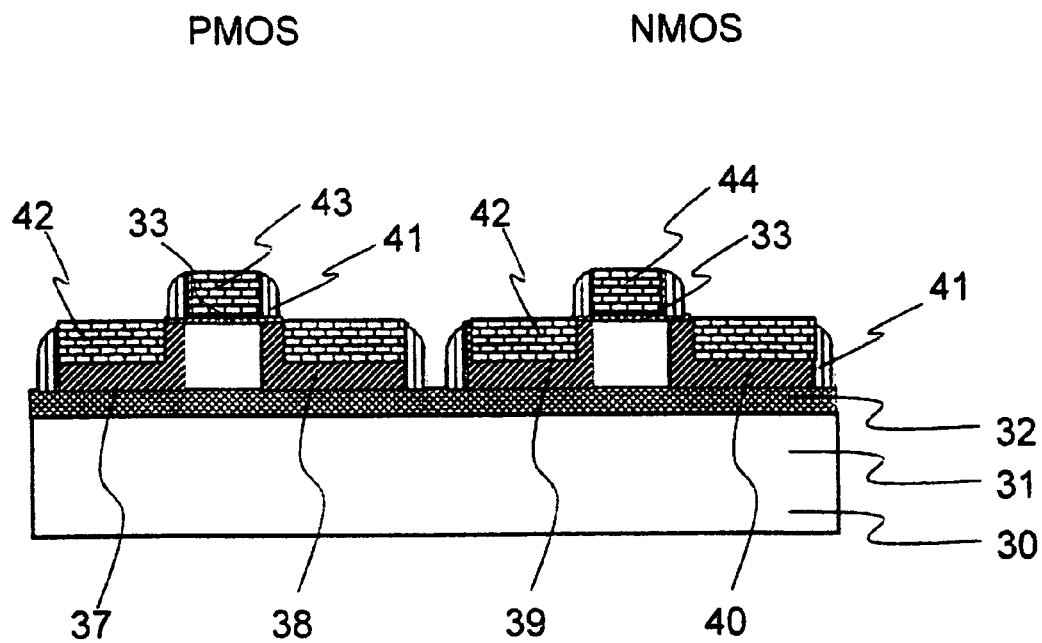
FIG. 16A is a cross-section view for depicting the transistor manufacturing process according to the second embodiment of the present invention.
Figure 16B:
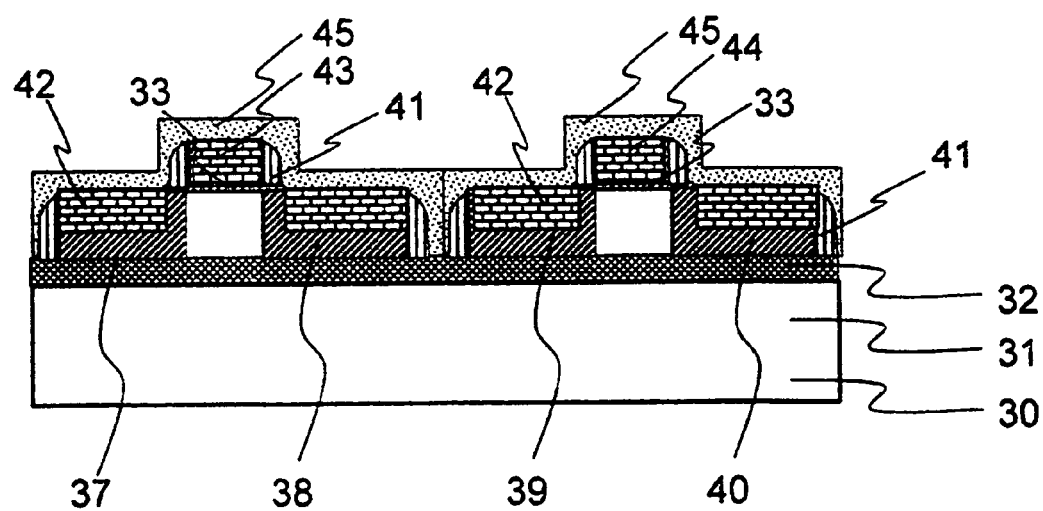
FIG. 16B is a cross-section view for depicting the transistor manufacturing process according to the second embodiment of the present invention.
Figure 18C:
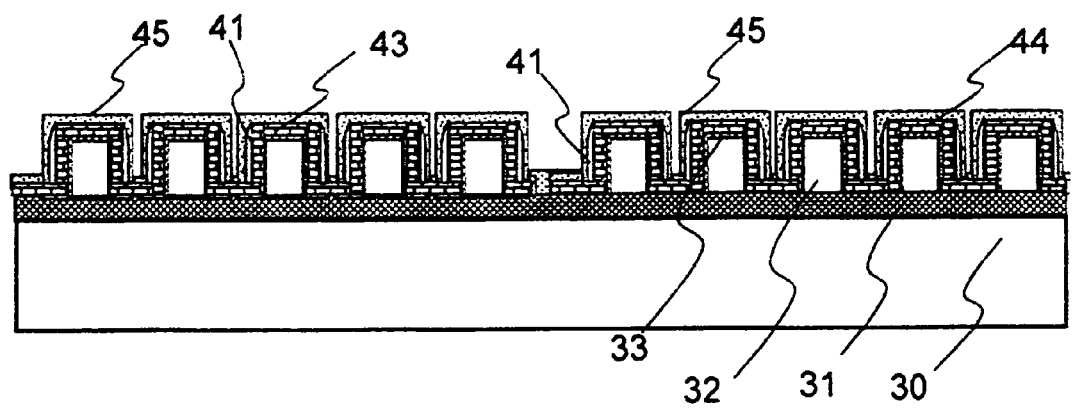
FIG. 18C is a cross-section view for depicting the transistor manufacturing process according to the second embodiment of the present invention.
Figure 22A:
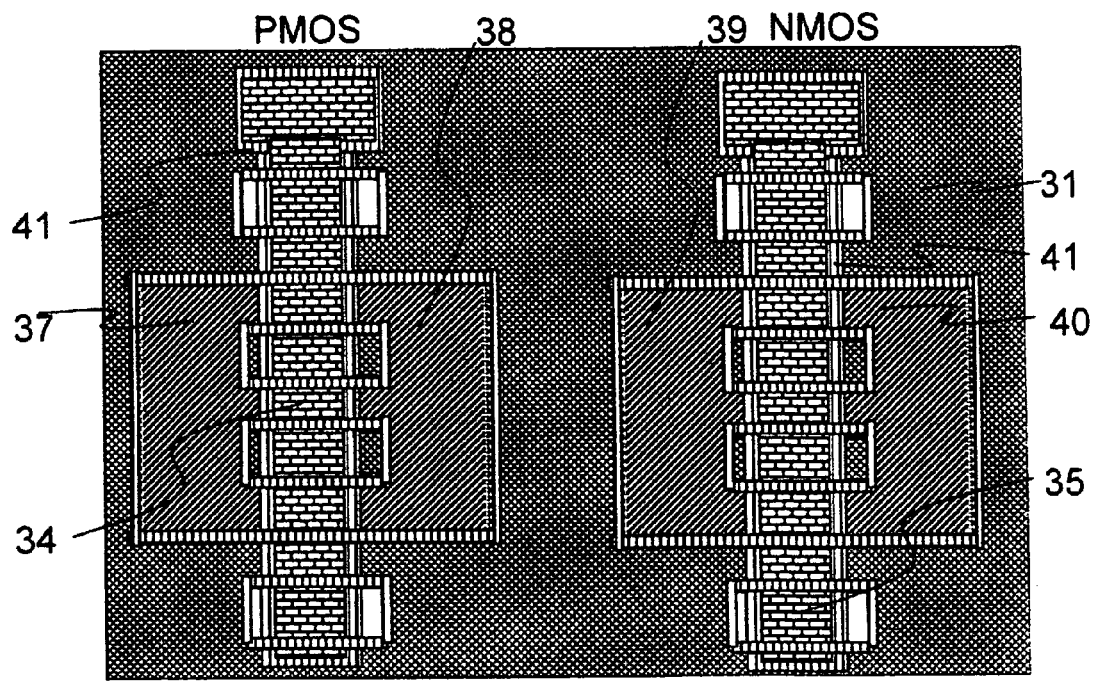
FIG. 22A is a cross-section view for depicting the transistor manufacturing process according to the second embodiment of the present invention.
Figure 22B:
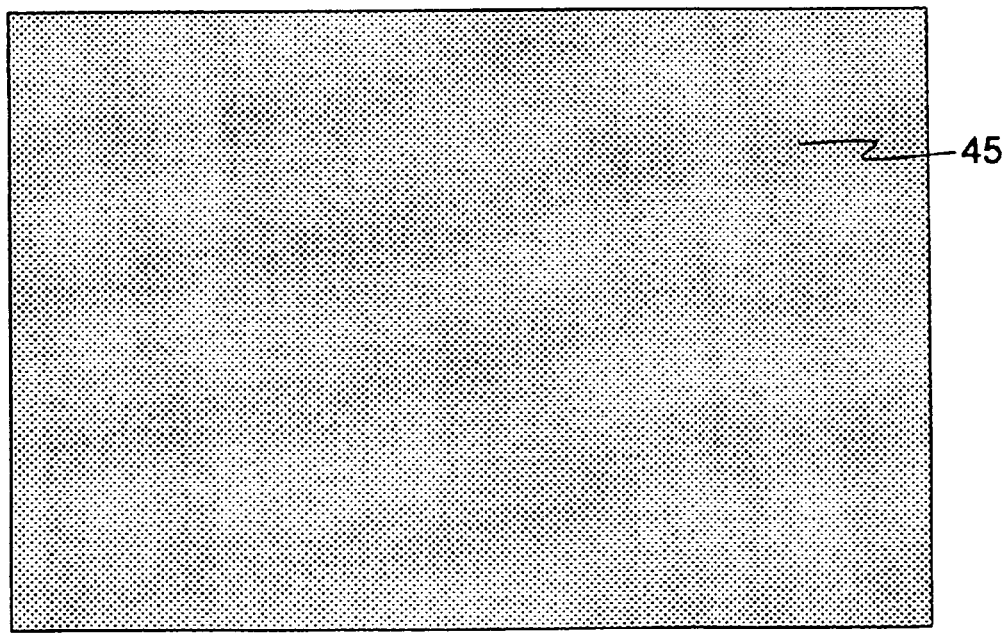
FIG. 22B is a cross-section view for depicting the transistor manufacturing process according to the second embodiment of the present invention.

Next, a silicon nitride film 45 having a tensile strain is deposited on the entire surface to bring about a state shown in FIG. 16B, FIG. 18C and FIG. 22B, in which a compressive stress to press the FinFET on the substrate side is applied. Such a stress increases hole mobility of a transistor in the PMOS region. That is, in a conventionally-known stress applying scheme, a film providing a tensile stress is deposited in order to increase the mobility of the NMOS. However, in this scheme, the mobility of the PMOS is decreased. Therefore, on the PMOS, a method forming a film without a tensile stress or a film providing a compressive stress conversely is available. However, in a fin-channel MOS according to the present invention, it becomes possible to deposit a film having a tensile stress on both of the NMOS and the PMOS.

Next, a process for increasing the mobility of the NMOS is performed. After silicon is deposited on the entire surface, by patterning to a desired shape using a resist mask, silicon in the PMOS region is removed through dry etching. After an appropriated time is elapsed, chemical-mechanical polishing is performed, strain-applying silicon 46 is selectively buried in a space between the silicon nitride films 45 on an upper portion of the NMOS complete silicide gate electrode 44, thereby bringing about a state shown in FIG. 19A and FIG. 23A. Note that, in FIGS. 23A and 23B, for easy understanding, the silicon nitride film 45 is not shown. And, the crystalline state of the strain-applying silicon 46 may be an amorphous state or a polycrystalline state.

Figure 19A:
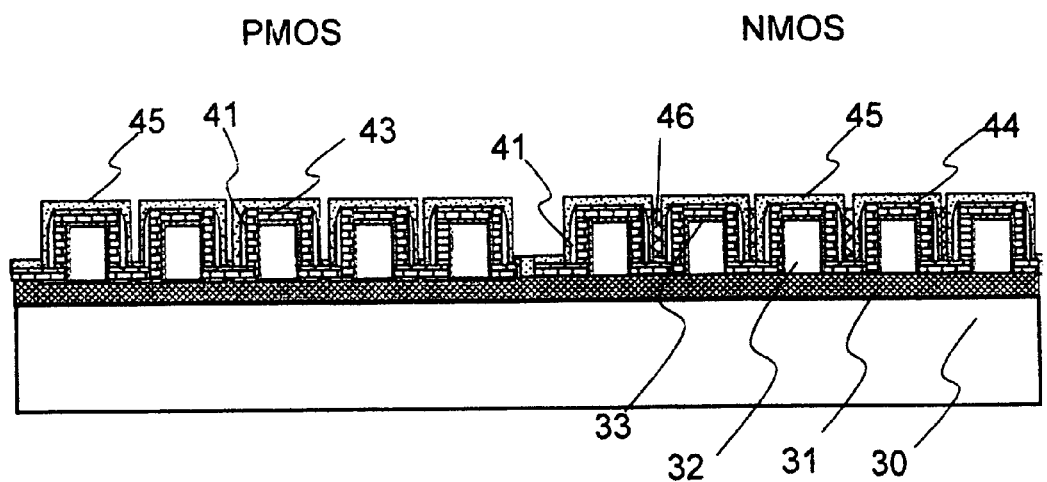
FIG. 19A is a cross-section view for depicting the transistor manufacturing process according to the second embodiment of the present invention.
Figure 19B:
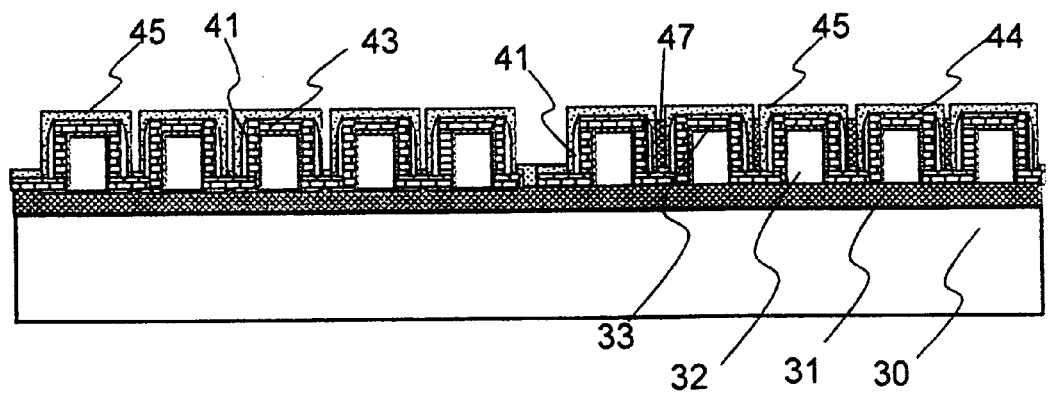
FIG. 19B is a cross-section view for depicting the transistor manufacturing process according to the second embodiment of the present invention.
Figure 23A:
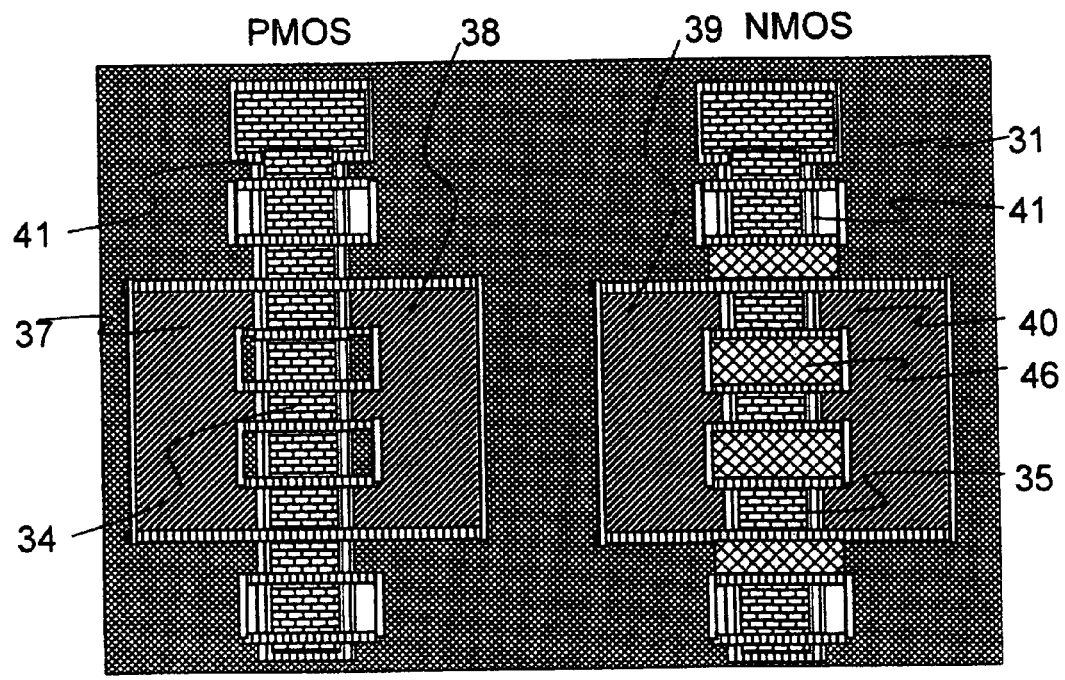
FIG. 23A is a cross-section view for depicting the transistor manufacturing process according to the second embodiment of the present invention.
Figure 23B:
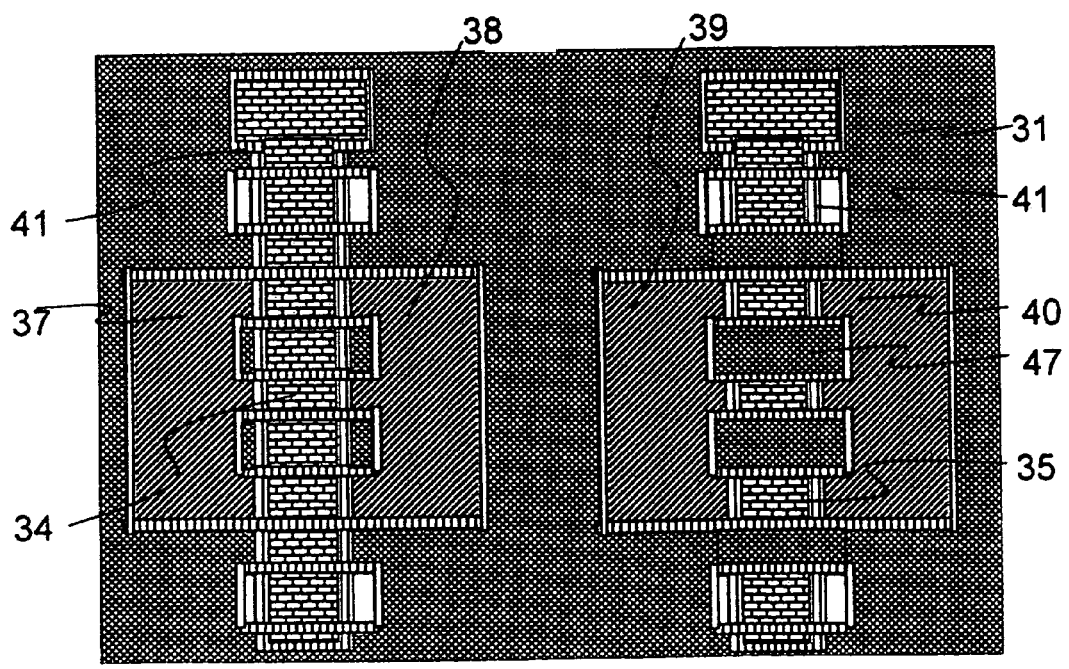
FIG. 23B is a cross-section view for depicting the transistor manufacturing process according to the second embodiment of the present invention.

Then, an oxidizing process is performed to change the strain-applying silicon 46 to strain-applying silicon dioxide 47, thereby bringing about a state in FIGS. 19B and 23B. As described above, the volume of silicon is doubled through oxidization, and therefore a strong stress is applied to the side walls of the fin. Since this stress is larger than a stress formed by the silicon nitride film 45, an effective tensile stress is applied to the side walls of the fin in the NMOS formation region. Thereafter, a desired wiring process is performed to manufacture a multi-channel FinFET.

The multi-channel FinFET manufactured in this manner, both of the PMOS and NMOS have a mobility larger than that of the normal MOSFET without strain application formed on the (100) surface by 50% or more. Thus, the scheme of effectively applying a strain to the multi-channel FinFET is revealed.

Third Embodiment

In the present embodiment, a method for manufacturing a multi-channel fin-type FET in which, in forming a complete silicide gate electrode, a stress is applied using the fact that the volume of the gate electrode is expanded, is disclosed. Also in the present embodiment, the mobility of the PMOS and the mobility of the NMOS can be increased at the same time.

Figure 24A:
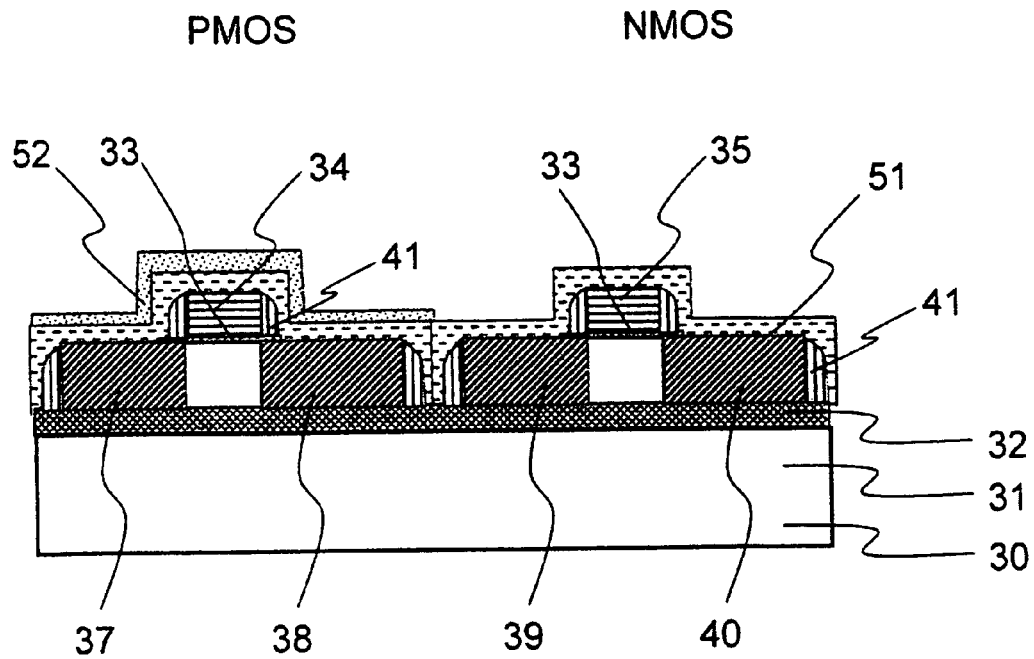
FIG. 24A is a cross-section view for depicting a transistor manufacturing process according to the third embodiment of the present invention.
Figure 24B:
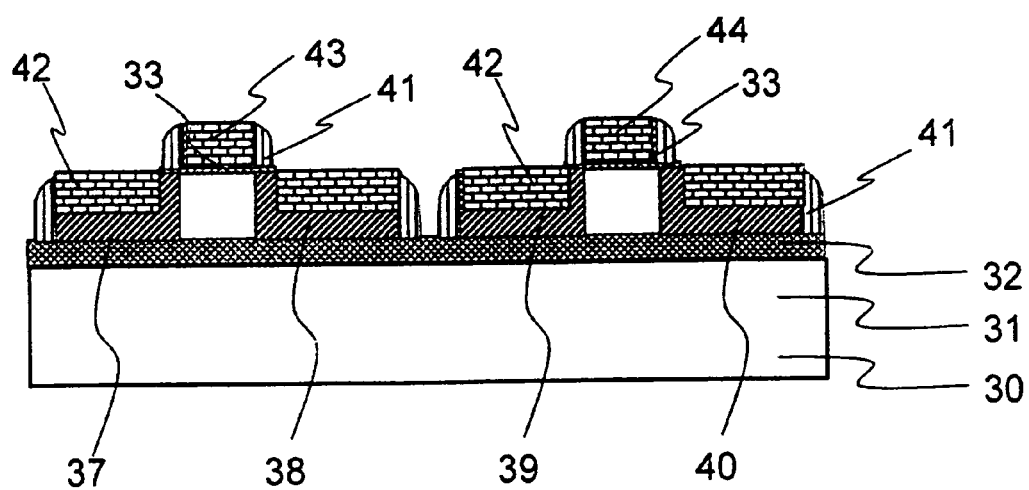
FIG. 24B is a cross-section view for depicting a transistor manufacturing process according to the third embodiment of the present invention.
Figure 25A:
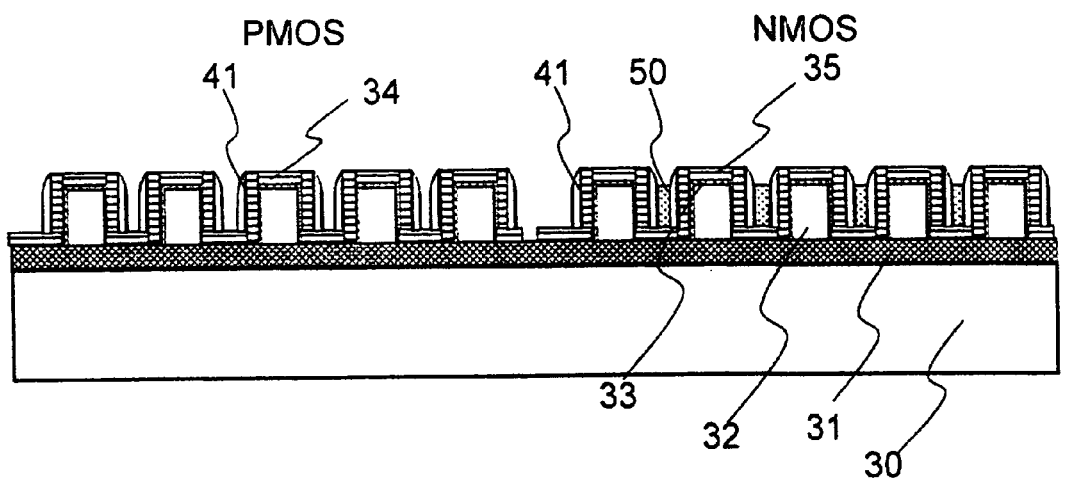
FIG. 25A is a cross-section view for depicting the transistor manufacturing process according to the third embodiment of the present invention.
Figure 25B:
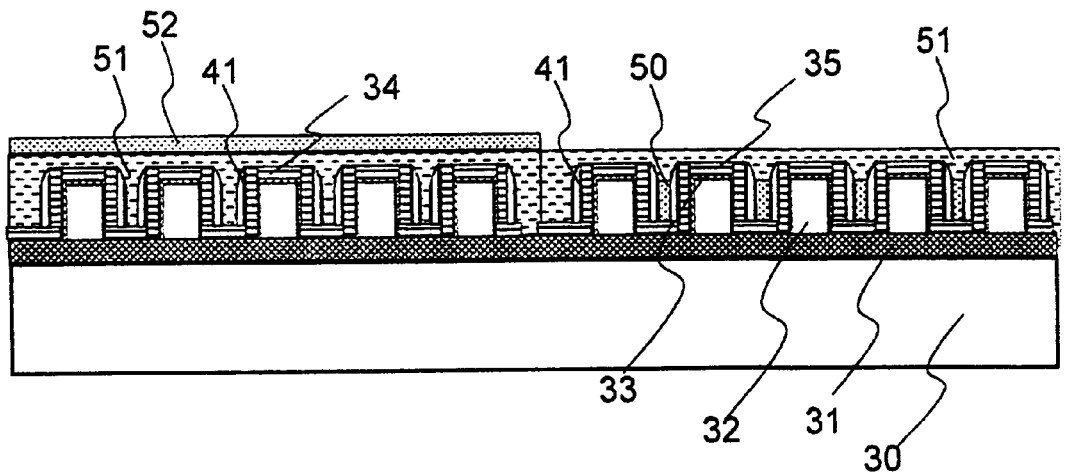
FIG. 25B is a cross-section view for depicting the transistor manufacturing process according to the third embodiment of the present invention.
Figure 25C:
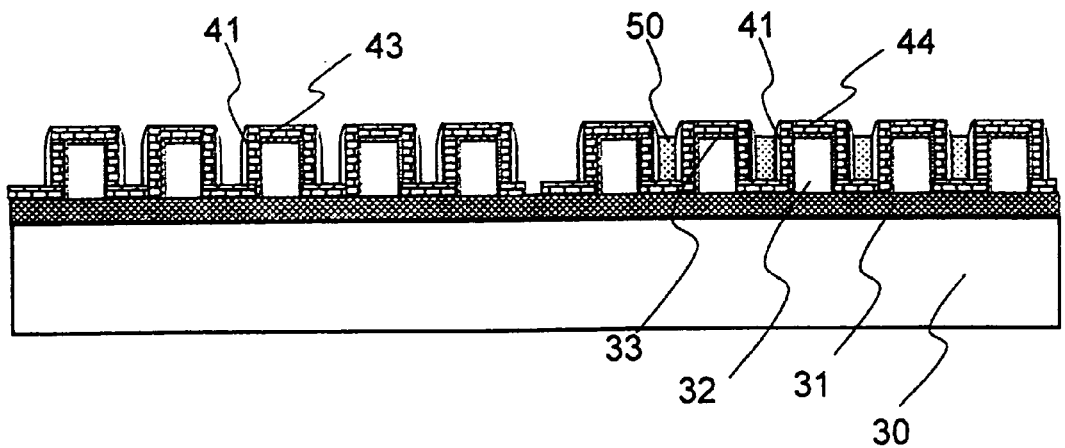
FIG. 25C is a cross-section view for depicting the transistor manufacturing process according to the third embodiment of the present invention.
Figure 26A:
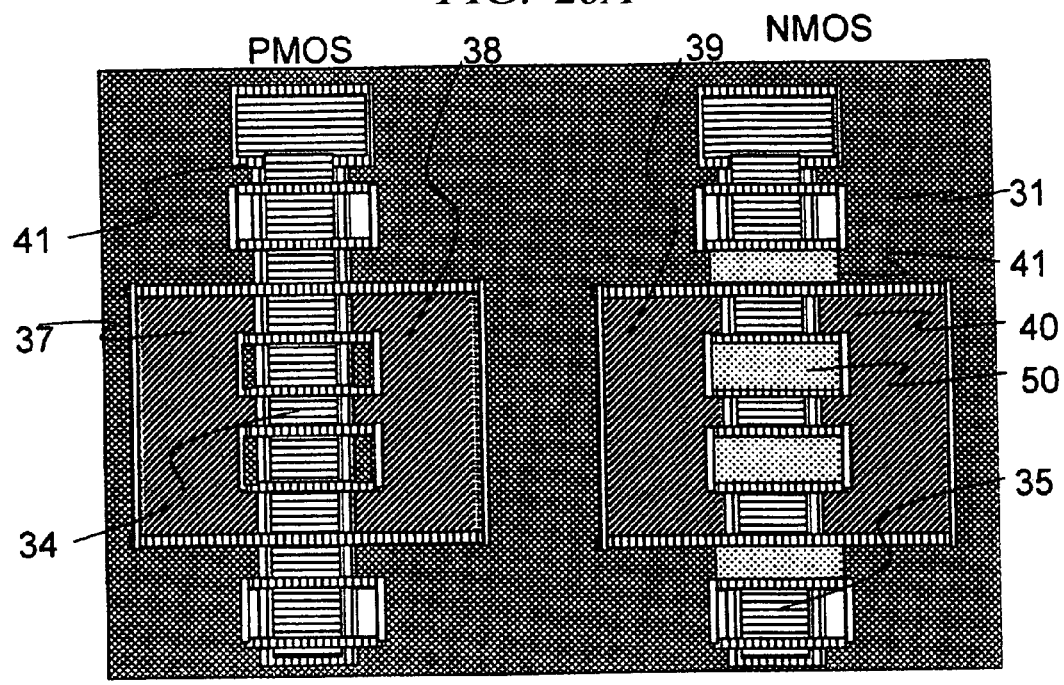
FIG. 26A is a cross-section view for depicting the transistor manufacturing process according to the third embodiment of the present invention.
Figure 26B:
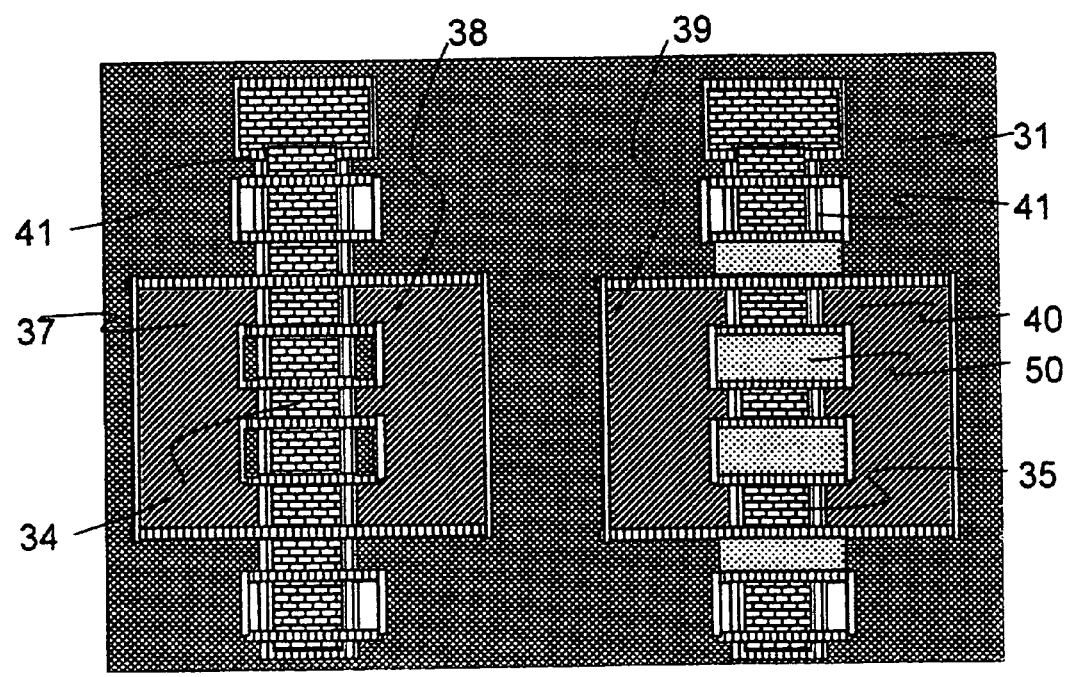
FIG. 26B is a cross-section view for depicting the transistor manufacturing process according to the third embodiment of the present invention.

FIGS. 24A and 24B are schematic drawings viewed from a section of the channel portion of the multi-channel FinFET showing a manufacturing process based on the present embodiment. And, FIGS. 25A to 25C are schematic drawings viewed from a section on the gate to show the manufacturing process. And, FIGS. 26A and 26B are schematic drawings viewed from an upper side of the substrate to show the manufacturing process. The process is described below in sequence.

Firstly, the state shown in FIG. 15B, FIG. 18A, and FIG. 21B where the side walls 41 have been formed are brought about through the method according to the second embodiment.

Next, after a silicon nitride film is deposited on the entire surface, by patterning to a desired shape using a resist mask, the silicon nitride film in the PMOS region is removed through dry etching. After an appropriate time is elapsed, chemical-mechanical polishing is performed to selectively bury a silicon nitride film for strain application 50 in a space between the side walls 41 of the NMOS, thereby bringing about a state shown in FIG. 25A and FIG. 26A.

Next, a Ni film 51 is thinly deposited on the entire surface through spattering. After an appropriate time is elapsed, a silicon nitride film 52 is deposited on the entire surface. Then, with patterning using photolithography, the silicon nitride film 52 is left only in the PMOS formation region, thereby bringing about a state shown in FIG. 24A and FIG. 25B.

Then, siliciding through annealing is performed so that a Ni silicide film is left selectively on a silicon-exposed portion.

In forming Ni silicide, the volume of the PMOS polycrystalline silicon gate electrode 34 is expanded. At this time, its upper portion is pressed by the silicon nitride film 52, and therefore a compressive strain is applied from the top to the bottom of the substrate to press the fin onto the substrate. Therefore, the mobility of the PMOS is increased. On the other hand, since no silicon nitride film 52 exists in the NMOS formation region, such a compressive stress is not applied. Instead, since the silicon nitride film for strain application 50 is buried, Ni silicide is formed, and repulsion occurs between adjacent side walls on the fin side according to the expansion of the volume of the NMOS polycrystalline silicon gate electrode 35. As with the second embodiment, this acts in a tensile direction on the side walls of the fin, therefore, mobility of the NMOS is increased. After Ni silicide is completely formed, the silicon nitride film 52 is removed. Then, a non-reacted portion of the Ni film is removed through a wet process, thereby bringing about a state shown in FIG. 24B, FIG. 25C and FIG. 26B.

Thereafter, a desired wiring process is performed so that a multi-channel FinFET is manufactured.

In thus manufactured multi-channel FinFET, both of the PMOS and NMOS have an increase in mobility approximately equivalent to the second embodiment. The number of processes can be slightly reduced compared with the method according to the third embodiment. And, the method according to the second embodiment and the method according to the third embodiment can be easily combined to apply a larger strain. Thus, the scheme of effectively applying a strain to the multi-channel FinFET has been revealed.

Fourth Embodiment

The manufacturing methods according to the second embodiment and the third embodiment are aimed at application to a multi-channel FinFET, a MOSFET of the next generation. Under the current circumstances, using a SOI substrate increases cost because the wafer is expensive. On the other hand, in the course of manufacturing described above, a method that can be readily applied to a current planar-type MOSFET is revealed.

In the present embodiment, a new method of applying a strain to a normal planar-type MOSFET is described. FIGS. 27A to 27D are drawings to show a process of manufacturing a STI portion.

Firstly, a normal (100) silicon substrate 61 is provided. Since the notch direction is not be restricted to the <100> direction in the present embodiment, a normally-used substrate having a notch oriented to a <110> direction is used.

Other than the substrate used in the present embodiment, a SOI substrate or a Strained Silicon On Insulator (SSOI) substrate, which has strain, can be used. And, in the case where no problem with manufacturing cost exists and an SSOI is used, since the mobility of the NMOS is increased, and by using the method according to the present embodiment, the mobility of the PMOS is also sufficiently increased, therefore, the performance can be increased mostly.

Next, an oxidizing process is performed on the surface of the (100) substrate 61 to form a silicon oxide film 62 having a film thickness on the order of 100 nm on the surface. Then, a silicon nitride film 63 is deposited so as to have a film thickness on the order of 100 nm, thereby bringing about a state shown in FIG. 27A.

Figure 27A:
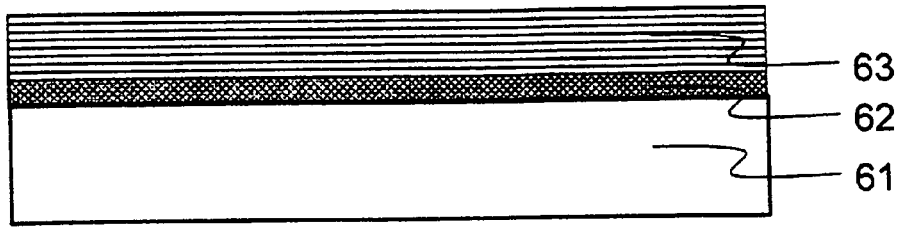
FIG. 27A is a cross-section view for depicting a transistor manufacturing process according to the fourth embodiment of the present invention.
Figure 27B:
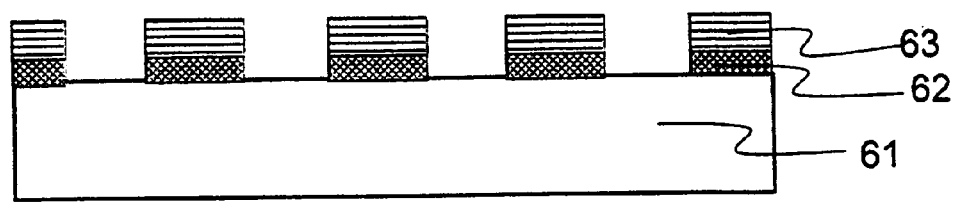
FIG. 27B is a cross-section view for depicting a transistor manufacturing process according to the fourth embodiment of the present invention.

Next, to process a desired region where an STI is formed, photolithography and dry etching are used to process a part of the silicon nitride film 63, thereby bringing about a state shown in FIG. 27B.

Figure 27C:
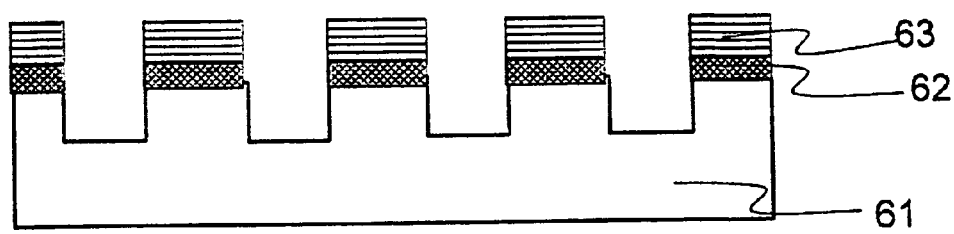
FIG. 27C is a cross-section view for depicting a transistor manufacturing process according to the fourth embodiment of the present invention.
Figure 27D:
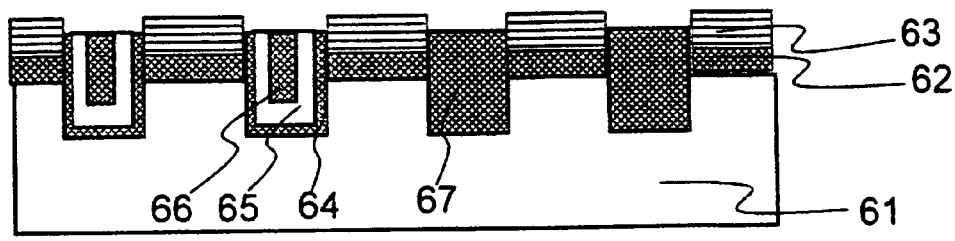
FIG. 27D is a cross-section view for depicting a transistor manufacturing process according to the fourth embodiment of the present invention.

Then, a part of the silicon oxide film 62 and a part of the silicon substrate 61 are removed through dry etching, thereby bringing about a state shown in FIG. 27C.

Next, after depositing a silicon oxide film 64 thinly on the entire surface, silicon 65 is thinly deposited. The crystalline state of silicon may be an amorphous state or a polycrystalline silicon state. In the present embodiment, amorphous silicon is used. Then, using patterning through photolithography, the silicon 65 deposited in the NMOS formation region is removed. Then, after depositing a silicon oxide film 66 on the entire surface, the surface is planarized through chemical-mechanical polishing, thereby bringing about a state shown in FIG. 27D. Here, in the NMOS formation region, a silicon oxide film 67 formed as a multilayered film of the silicon oxide film 64 and the silicon oxide film 66 is buried.

Figure 27E:
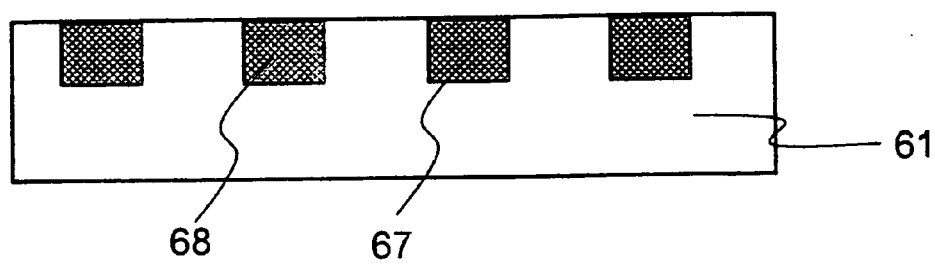
FIG. 27E is a cross-section view for depicting a transistor manufacturing process according to the fourth embodiment of the present invention.

Next, a thermal oxidizing process is performed to oxidize the silicon 65, therefore, a buried insulating film 68 is formed in the PMOS formation region. Here, in this thermal oxidizing process, since an extremely strong strain stress is applied to the silicon 65, an oxidizing rate is slowed. Therefore, some silicon in the buried insulating film 68 may be left not completely oxidized. Then, the silicon nitride film 63 and the silicon oxide film 62 are removed through wet etching, thereby bringing about a state shown in FIG. 27E.

By forming an STI in this manner, a compressive strain can be selectively applied to an active region of the PMOS formation region. The direction of the compressive strain can be in parallel or perpendicular to the channel.

Then, through a normal CMOS process disclosed in the first embodiment, a transistor is formed. On the other hand, as for the NMOS, a stress is not sufficiently applied, therefore, the following method is disclosed in the present embodiment.

Figure 28A:
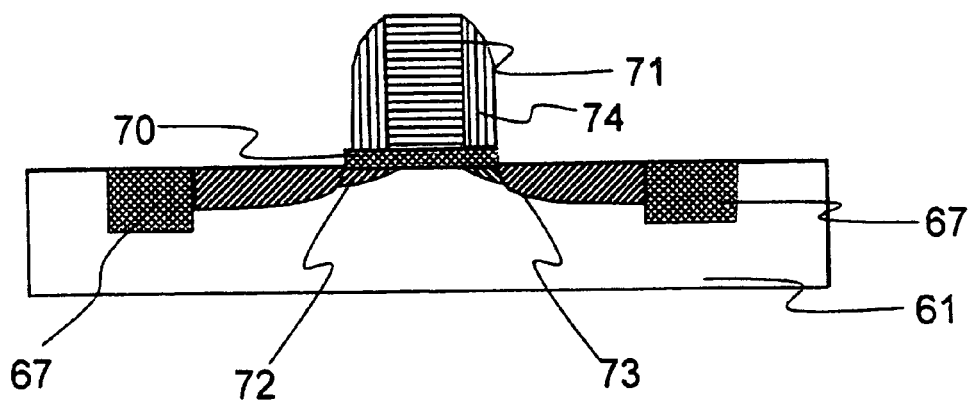
FIG. 28A is a cross-section view for depicting the transistor manufacturing process according to the fourth embodiment of the present invention.
Figure 28B:
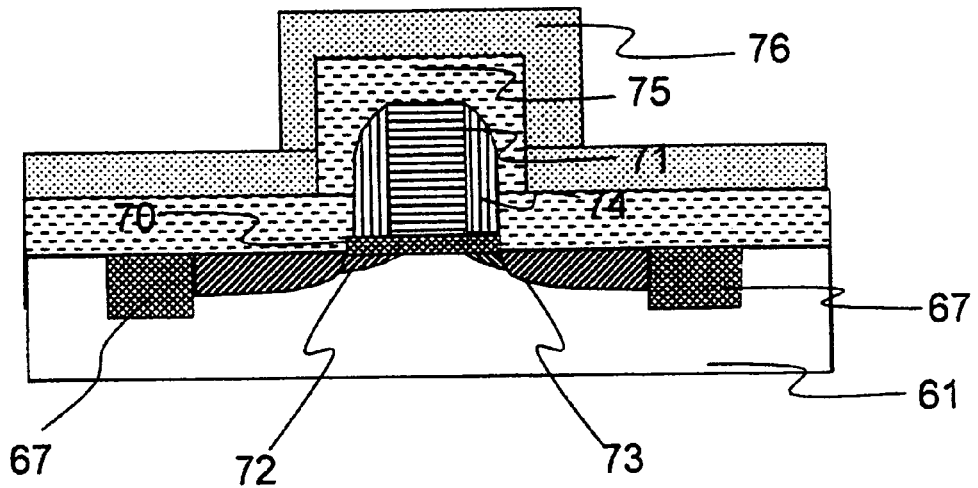
FIG. 28B is a cross-section view for depicting the transistor manufacturing process according to the fourth embodiment of the present invention.
Figure 28C:
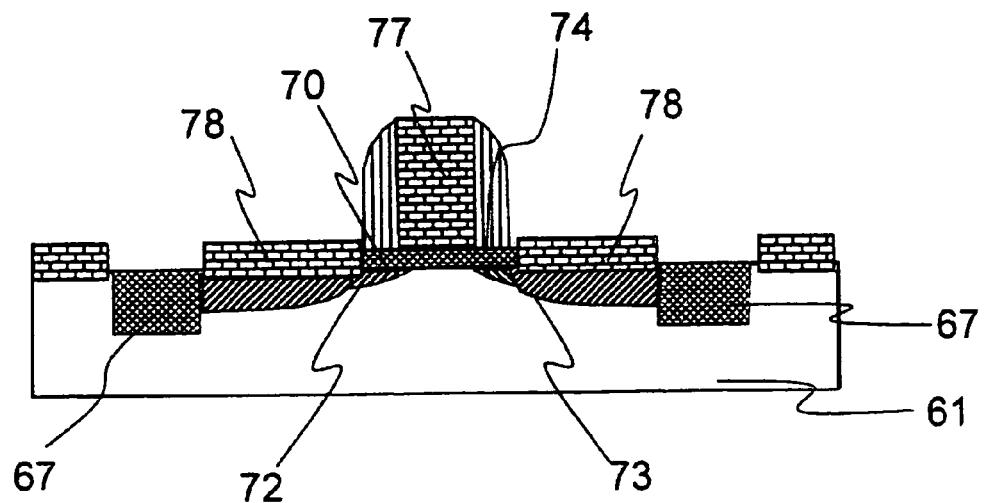
FIG. 28C is a cross-section view for depicting the transistor manufacturing process according to the fourth embodiment of the present invention.

FIGS. 28A to 28C show a manufacturing process.

Firstly, an NMOS transistor is formed through processes similar to those according to the first embodiment so as to form a configuration in which a gate insulating film 70, a polycrystalline silicon gate electrode 71, a source diffusion layer 72, a drain diffusion layer 73 and side walls 74 are formed on the active region defined by the silicon oxide film 67, as shown in FIG. 28A.

Next, a Ni film 75 is thinly deposited on the entire surface through spattering. After an appropriate time is elapsed, a silicon nitride film 76 is deposited on the entire surface. Then, through patterning using photolithography, the silicon nitride film 76 is left only in the NMOS formation region, thereby bringing about a state shown in FIG. 27B.

Then, siliciding through annealing is performed to left a Ni silicide film selectively on a silicon-exposed portion. By formation of Ni silicide, the volume of the polycrystalline silicon gate electrode 71 is expanded. At this time, since its upper portion is pressed by the silicon nitride film 76, a compressive strain is applied from the top to the bottom of the substrate in a direction to press the polycrystalline silicon gate electrode 71 onto the substrate. Therefore, a tensile stress is applied to the channel portion, therefore, the mobility of the NMOS is increased. On the other hand, in the PMOS formation region, no silicon nitride film 76 exists, so, such a compressive stress is not applied.

After Ni silicide is completely formed, the silicon nitride film 76 is removed. After that, a non-reacted portion of the Ni film is removed through a wet process, thereby bringing about a state shown in FIG. 27C.

Thereafter, a desired wiring process is performed, as a result, a device with a high mobility of both of the NMOS and the PMOS is manufactured inexpensively.

What is claimed is:

1. A semiconductor device including a p-type field-effect transistor, comprising:
   a semiconductor substrate;
   a BOX layer formed on the semiconductor substrate;
   a SOI layer formed so as to extend on the BOX layer in a first direction, with a plane direction of an upper surface and side surface being a (100) surface;
   a gate electrode formed on a pair of side surfaces parallel to the first direction and an upper surface of the SOI later via a gate insulating film and extending in a <010> direction of the SOI layer;
   a channel formed in the SOI layer under the gate electrode, in which a current flows in a <110> direction of the SOI layer; and
   an insulating film having a tensile strain, formed on the BOX layer, the side surfaces of the SOI layer, the upper surface of the SOI layer, and an upper surface of the gate electrode successively.

2. The semiconductor device according to claim 1, wherein the insulating film is a silicon nitride film.

* * * * *